United States Patent
Cui et al.

(10) Patent No.: US 11,948,780 B2
(45) Date of Patent: Apr. 2, 2024

(54) AUTOMATIC ELECTROSTATIC CHUCK BIAS COMPENSATION DURING PLASMA PROCESSING

(71) Applicant: Applied Materials, Inc., Santa Clara, CA (US)

(72) Inventors: Linying Cui, Cupertino, CA (US); James Rogers, Los Gatos, CA (US); Leonid Dorf, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 423 days.

(21) Appl. No.: 17/319,013

(22) Filed: May 12, 2021

(65) Prior Publication Data
US 2022/0367158 A1 Nov. 17, 2022

(51) Int. Cl.
  H01J 37/32 (2006.01)
  H01L 21/683 (2006.01)
(52) U.S. Cl.
  CPC .. *H01J 37/32715* (2013.01); *H01J 37/32146* (2013.01); *H01J 37/32568* (2013.01); *H01L 21/6831* (2013.01); *H01J 2237/2007* (2013.01); *H01J 2237/3341* (2013.01)
(58) Field of Classification Search
  None
  See application file for complete search history.

(56) References Cited

U.S. PATENT DOCUMENTS

| | | |
|---|---|---|
| 4,070,589 A | 1/1978 | Martinkovic |
| 4,340,462 A | 7/1982 | Koch |
| 4,464,223 A | 8/1984 | Gorin |
| 4,504,895 A | 3/1985 | Steigerwald |

(Continued)

FOREIGN PATENT DOCUMENTS

| | | |
|---|---|---|
| CN | 101990353 A | 3/2011 |
| CN | 102084024 A | 6/2011 |

(Continued)

OTHER PUBLICATIONS

International Search Report and Written Opinion for PCT/US2022/027892 dated Aug. 26, 2022.

(Continued)

*Primary Examiner* — Ram N Kackar
*Assistant Examiner* — Laureen Chan
(74) *Attorney, Agent, or Firm* — Patterson + Sheridan, LLP

(57) ABSTRACT

Embodiments of the present disclosure relate to a system for pulsed direct-current (DC) biasing and clamping a substrate. In one embodiment, the system includes a plasma chamber having an electrostatic chuck (ESC) for supporting a substrate. An electrode is embedded in the ESC and is electrically coupled to a biasing and clamping network. The biasing and clamping network includes at least a shaped DC pulse voltage source and a clamping network. The clamping network includes a DC source and a diode, and a resistor. The shaped DC pulse voltage source and the clamping network are connected in parallel. The biasing and clamping network automatically maintains a substantially constant clamping voltage, which is a voltage drop across the electrode and the substrate when the substrate is biased with pulsed DC voltage, leading to improved clamping of the substrate.

15 Claims, 16 Drawing Sheets

(56) References Cited

U.S. PATENT DOCUMENTS

| | | |
|---|---|---|
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,242,561 A | 9/1993 | Sato |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 * | 3/2001 | Dahimene ......... H01L 21/6831 279/128 |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |

(56) References Cited

U.S. PATENT DOCUMENTS

| | | |
|---|---|---|
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Arson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |

(56) References Cited

U.S. PATENT DOCUMENTS

| | | |
|---|---|---|
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapi 70nski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1* | 6/2002 | Kaji ............... H01J 37/32678 156/345.46 |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0112536 A1 | 6/2004 | Quon |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |

(56) References Cited

U.S. PATENT DOCUMENTS

| | | |
|---|---|---|
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0190350 A1* | 7/2010 | Yatsuda ............ H01J 37/32146 |
| | | 156/345.28 |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman |
| 2012/0319584 A1 | 12/2012 | Brouk et al. |
| 2013/0050892 A1 | 2/2013 | Kuthi et al. |
| 2013/0059448 A1 | 3/2013 | Marakhtanov |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1 | 5/2014 | Finley et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0365531 A1* | 12/2017 | Tedeschi ................ G01D 5/24 |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |

(56) References Cited

U.S. PATENT DOCUMENTS

| | | |
|---|---|---|
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157041 A1 | 5/2019 | Zyl et al. |
| 2019/0157042 A1 | 5/2019 | Van Zyl et al. |
| 2019/0157043 A1* | 5/2019 | Shaw ............... H01J 37/32174 |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0259562 A1 | 8/2019 | Dorf et al. |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0350072 A1* | 11/2019 | Dorf ............... H01J 37/3467 |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1* | 5/2020 | Ziemba ............. H01J 37/32706 |
| 2020/0176221 A1 | 6/2020 | Prager et al. |
| 2020/0227230 A1 | 7/2020 | Ziemba et al. |
| 2020/0227289 A1 | 7/2020 | Song et al. |
| 2020/0234922 A1 | 7/2020 | Dorf |
| 2020/0234923 A1 | 7/2020 | Dorf |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043424 A1* | 2/2021 | Mori ..................... H05H 1/46 |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210315 A1 | 7/2021 | Ziemba et al. |
| 2021/0210315 A1 | 7/2021 | Ziemba et al. |
| 2021/0249227 A1 | 8/2021 | Bowman et al. |
| 2021/0272775 A1 | 9/2021 | Koshimizu |
| 2021/0288582 A1 | 9/2021 | Ziemba et al. |

FOREIGN PATENT DOCUMENTS

| | | |
|---|---|---|
| CN | 101707186 B | 2/2012 |
| CN | 105408993 A | 3/2016 |
| CN | 106206234 A | 12/2016 |
| CN | 104752134 B | 2/2017 |
| EP | 665306 A1 | 8/1995 |
| EP | 983394 A1 | 3/2000 |
| EP | 1119033 A1 | 7/2001 |
| EP | 1203441 A1 | 5/2002 |
| EP | 1214459 A1 | 6/2002 |
| EP | 1418670 A1 | 5/2004 |
| EP | 1691481 A1 | 8/2006 |
| EP | 1701376 A1 | 9/2006 |
| EP | 1708239 A1 | 10/2006 |
| EP | 1780777 A1 | 5/2007 |
| EP | 1852959 A1 | 11/2007 |
| EP | 2096679 A1 | 9/2009 |
| EP | 2221614 A1 | 8/2010 |
| EP | 2541584 A1 | 1/2013 |
| EP | 2580368 A1 | 4/2013 |
| EP | 2612544 A1 | 7/2013 |
| EP | 2838112 A1 | 2/2015 |
| EP | 2991103 A1 | 3/2016 |
| EP | 3086359 A1 | 10/2016 |
| EP | 3396700 A1 | 10/2018 |
| EP | 3616234 A1 | 3/2020 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 4418424 B2 | 2/2010 |
| JP | 2011035266 A | 2/2011 |
| JP | 5018244 B2 | 9/2012 |
| JP | 2014112644 A | 6/2014 |
| JP | 2016-225439 A | 12/2016 |
| JP | 6741461 B2 | 8/2020 |
| KR | 100757347 B1 | 9/2007 |
| KR | 10-2007-0098556 A | 10/2007 |
| KR | 20160042429 A | 4/2016 |
| KR | 20190129745 A | 11/2019 |
| KR | 20200036947 A | 4/2020 |
| TW | 498706 B | 8/2002 |
| TW | 201717247 A | 5/2017 |
| WO | 1998053116 A1 | 11/1998 |
| WO | 2000017920 A1 | 3/2000 |
| WO | 2000030147 A1 | 5/2000 |
| WO | 2000063459 A1 | 10/2000 |

(56) References Cited

FOREIGN PATENT DOCUMENTS

| | | |
|---|---|---|
| WO | 2001005020 A1 | 1/2001 |
| WO | 2001012873 A1 | 2/2001 |
| WO | 2001013402 A1 | 2/2001 |
| WO | 2002052628 A1 | 7/2002 |
| WO | 2002054835 A2 | 7/2002 |
| WO | 2002059954 A1 | 8/2002 |
| WO | 2003037497 A2 | 5/2003 |
| WO | 2003052882 A2 | 6/2003 |
| WO | 2003054911 A2 | 7/2003 |
| WO | 2003077414 A2 | 9/2003 |
| WO | 2004084394 A1 | 9/2004 |
| WO | 2005124844 A1 | 12/2005 |
| WO | 2007118042 A2 | 10/2007 |
| WO | 2008016747 A2 | 2/2008 |
| WO | 2008050619 A1 | 5/2008 |
| WO | 2008061775 A1 | 5/2008 |
| WO | 2008061784 A1 | 5/2008 |
| WO | 2008062663 A1 | 5/2008 |
| WO | 2009012804 A1 | 1/2009 |
| WO | 2009069670 A1 | 6/2009 |
| WO | 2009111473 A2 | 9/2009 |
| WO | 2011073093 A1 | 6/2011 |
| WO | 2011087984 A2 | 7/2011 |
| WO | 2011156055 A1 | 12/2011 |
| WO | 2012030500 A1 | 3/2012 |
| WO | 2012109159 A1 | 8/2012 |
| WO | 2012122064 A1 | 9/2012 |
| WO | 2013000918 A1 | 1/2013 |
| WO | 2013016619 A1 | 1/2013 |
| WO | 2013084459 A1 | 6/2013 |
| WO | 2013088677 A1 | 6/2013 |
| WO | 2013099133 A1 | 7/2013 |
| WO | 2013114882 A1 | 8/2013 |
| WO | 2013118660 A1 | 8/2013 |
| WO | 2013125523 A1 | 8/2013 |
| WO | 2013187218 A1 | 12/2013 |
| WO | 2014035889 A1 | 3/2014 |
| WO | 2014035894 A1 | 3/2014 |
| WO | 2014035897 A1 | 3/2014 |
| WO | 2014036000 A1 | 3/2014 |
| WO | 2014124857 A2 | 8/2014 |
| WO | 2014197145 A1 | 12/2014 |
| WO | 2015060185 A1 | 4/2015 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2016059207 A1 | 4/2016 |
| WO | 2016060058 A1 | 4/2016 |
| WO | 2016060063 A1 | 4/2016 |
| WO | 2015073921 A8 | 5/2016 |
| WO | 2016104098 A1 | 6/2016 |
| WO | 2016128384 A1 | 8/2016 |
| WO | 2016131061 A1 | 8/2016 |
| WO | 2016170989 A1 | 10/2016 |
| WO | 2017172536 A1 | 10/2017 |
| WO | 2017208807 A1 | 12/2017 |
| WO | 2018048925 A1 | 3/2018 |
| WO | 2018111751 A1 | 6/2018 |
| WO | 2018170010 A1 | 9/2018 |
| WO | 2018197702 A1 | 11/2018 |
| WO | 2019036587 A1 | 2/2019 |
| WO | 2019040949 A1 | 2/2019 |
| WO | 2019099102 A1 | 5/2019 |
| WO | 2019099870 A1 | 5/2019 |
| WO | 2019185423 A1 | 10/2019 |
| WO | 2019225184 A1 | 11/2019 |
| WO | 2019239872 A1 | 12/2019 |
| WO | 2019244697 A1 | 12/2019 |
| WO | 2019244698 A1 | 12/2019 |
| WO | 2019244734 A1 | 12/2019 |
| WO | 2019245729 A1 | 12/2019 |
| WO | 2020004048 A1 | 1/2020 |
| WO | 2020017328 A1 | 1/2020 |
| WO | 2020022318 A1 | 1/2020 |
| WO | 2020022319 A1 | 1/2020 |
| WO | 2020026802 A1 | 2/2020 |
| WO | 2020036806 A1 | 2/2020 |
| WO | 2020037331 A1 | 2/2020 |
| WO | 2020046561 A1 | 3/2020 |
| WO | 2020051064 A1 | 3/2020 |
| WO | 2020112921 A1 | 6/2020 |
| WO | 2020121819 A1 | 6/2020 |
| WO | 2020145051 A1 | 7/2020 |
| WO | 2021003319 A1 | 1/2021 |
| WO | 2021062223 A1 | 4/2021 |
| WO | 2021097459 A1 | 5/2021 |
| WO | 2021134000 A1 | 7/2021 |

OTHER PUBLICATIONS

The International Search Report and the Written Opinion for International Application No. PCT/US2021/040380; dated Oct. 27, 2021; 10 pages.
International Search Report and Written Opinion dated Feb. 4, 2022 for Application No. PCT/US2021/054806.
International Search Report and Written Opinion dated Feb. 4, 2022 for Application No. PCT/US2021/054814.
U.S. Appl. No. 17/346,103, filed Jun. 11, 2021.
U.S. Appl. No. 17/349,763, filed Jun. 16, 2021.
U.S. Appl. No. 63/242,410, filed Sep. 9, 2021.
U.S. Appl. No. 17/410,803, filed Aug. 24, 2021.
U.S. Appl. No. 17/537,107, filed Nov. 29, 2021.
U.S. Appl. No. 17/352,165, filed Jun. 18, 2021.
U.S. Appl. No. 17/352,176, filed Jun. 18, 2021.
U.S. Appl. No. 17/337,146, filed Jun. 2, 2021.
U.S. Appl. No. 17/361,178, filed Jun. 28, 2021.
U.S. Appl. No. 63/210,956, filed Jun. 15, 2021.
U.S. Appl. No. 17/475,223, filed Sep. 14, 2021.
U.S. Appl. No. 17/537,314, filed Nov. 29, 2021.
Chinese Office Action for 201880053380.1 dated Dec. 2, 2021.
Wang, S.B., et al.—"Control of ion energy distribution at substrates during plasma processing," Journal of Applied Physics, vol. 88, No. 2, Jul. 15, 2000, pp. 643-646.
Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.
Eagle Harbor Technologies webpage—"EHT Integrator Demonstration at DIII-D," 2015, 1 page.
Eagle Harbor Technologies webpage—"High Gain and Frequency Ultra-Stable Integrators for ICC and Long Pulse ITER Applications," 2012, 1 page.
Eagle Harbor Technologies webpage—High Gain and Frequency Ultra-Stable Integrators for Long Pulse and/or High Current Applications, 2018, 1 page.
Eagle Harbor Technologies webpage—"In Situ Testing of EHT Integrators on a Tokamak," 2015, 1 page.
Eagle Harbor Technologies webpage—"Long-Pulse Integrator Testing with DIII-D Magnetic Diagnostics," 2016, 1 page.
Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.
Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp. 1-6, 2014.
Semiconductor Components Industries, LLC (SCILLC)—"Switch-Mode Power Supply" Reference Manual, SMPSRM/D, Rev. 4, Apr. 2014, ON Semiconductor, 73 pages.
Sunstone Circuits—"Eagle Harbor Tech Case Study," date unknown, 4 pages.
Electrical 4 U webpage—"Clamping Circuit," Aug. 29, 2018, 1 page.

(56) References Cited

OTHER PUBLICATIONS

Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.
Richard Barnett et al. A New Plasma Source for Next Generation MEMS Deep Si Etching: Minimal Tilt, Improved Profile Uniformity and Higher Etch Rates, SPP Process Technology Systems. 2010.
S.B. Wang et al. "Ion Bombardment Energy and SiO 2/Si Fluorocarbon Plasma Etch Selectivity", Journal of Vacuum Science & Technology A 19, 2425 (2001).
Zhen-hua Bi et al., A brief review of dual-frequency capacitively coupled discharges, Current Applied Physics, vol. 11, Issue 5, Supplement, 2011, pp. S2-S8.
Chang, Bingdong, "Oblique angled plasma etching for 3D silicon structures with wiggling geometries" 31(8), [085301]. https://doi.org/10.1088/1361-6528/ab53fb. DTU Library. 2019.
Michael A. Lieberman, "A short course of the principles of plasma discharges and materials processing", Department of Electrical Engineering and Computer Sciences University of California, Berkeley, CA 94720.
Dr. Steve Sirard, "Introduction to Plasma Etching", Lam Research Corporation. 64 pages.
Zhuoxing Luo, B.S., M.S, "RF Plasma Etching With a DC Bias" A Dissertation in Physics. Dec. 1994.
Michael A. Lieberman, "Principles of Plasma Discharges and Material Processing", A Wiley Interscience Publication. 1994.
Yiting Zhang et al. "Investigation of feature orientation and consequences of ion tilting during plasma etching with a three-dimensional feature profile simulator", Nov. 22, 2016.
Lin, Jianliang, et al.,—"Diamond like carbon films deposited by HiPIMS using oscillatory voltage pulses," Surface & Coatings Technology 258, 2014, published by Elsevier B.V., pp. 1212-1222.
Eagle Harbor Technologies presentation by Dr. Kenneth E. Miller—"The EHT Long Pulse Integrator Program," ITPA Diagnostic Meeting, General Atomics, Jun. 4-7, 2013, 18 pages.
PCT International Search Report and Written Opinion dated Nov. 9, 2018, for International Application No. PCT/US2018/043032.
Taiwan Office Action for Application No. 107125613 dated Dec. 24, 2020, 16 pages.
PCT International Search Report and Written Opinion dated Nov. 7, 2018, for International Application No. PCT/US2018/042965.
International Search Report and Written Opinion for PCT/US2019/052067 dated Jan. 21, 2020.
PCT Notification of Transmittal of the International Search Report and the Written Opinion of the International Searching Authority for International Application No. PCT/US2019/048392; dated Dec. 16, 2019; 13 pages.
PCT International Search Report and Written Opinion dated Nov. 7, 2018, for International Application No. PCT/US2018/042961.
PCT International Search Report and Written Opinion dated Nov. 7, 2018, for International Application No. PCT/US2018/042956.
U.S. Appl. No. 62/433,204; entitled Creating Arbitrarily-Shaped Ion Energy Distribution Function (IEDF) Using Shaped-Pulse (EV) Bias; by Leonid Dorf, et al.; filed Dec. 16, 2016; 22 total pages.
U.S. Appl. No. 15/424,405; entitled System for Tunable Workpiece Biasing in a Plasma Reactor; by Travis Koh, et al.; filed Feb. 3, 2017; 29 total pages.
U.S. Appl. No. 15/618,082; entitled Systems and Methods for Controlling a Voltage Waveform at a Substrate During Plasma Processing; by Leonid Dorf, et al.; filed Jun. 8, 2017; 35 total pages.
PCT Notification of Transmittal of the International Search Report and the Written Opinion of the International Searching Authority for International Application No. PCT/US2018/046171; dated Nov. 28, 2018; 10 total pages.
PCT Notification of Transmittal of the International Search Report and the Written Opinion of the International Searching Authority for International Application No. PCT/US2018/046182; dated Nov. 30, 2018; 10 total pages.
PCT/US2020/014453 Interanational Search Report and Written Opinion dated May 14, 2020 consists of 8 pages.
Korean Office Action for 10-2020-7007495 dated Jun. 14, 2021.
Taiwan Office Action for 108132682 dated Mar. 24, 2022.

\* cited by examiner

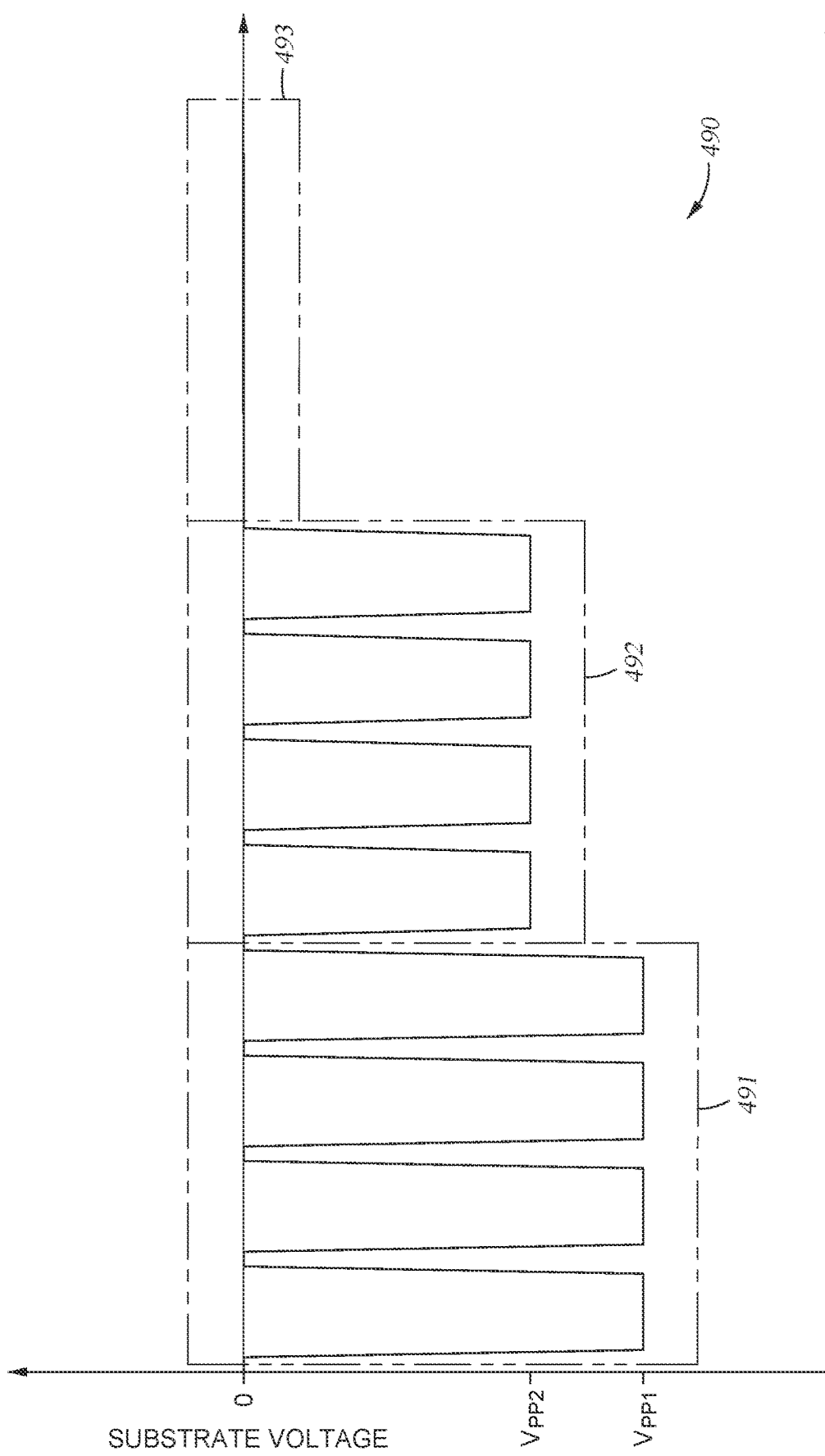

AUTOMATIC ELECTROSTATIC CHUCK BIAS COMPENSATION DURING PLASMA PROCESSING

BACKGROUND

Field

Embodiments of the present disclosure generally relate to a system used in semiconductor manufacturing. More specifically, embodiments of the present disclosure relate to a system for biasing and clamping a substrate during plasma processing.

Description of the Related Art

Ion bombardment is often used as a source of activation energy for chemical and physical processes in plasma etch and plasma enhanced chemical vapor deposition (PECVD) processes for processing a semiconductor substrate. High energy ions accelerated by plasma sheath are also highly directional and can be used for etching high aspect ratio features. Conventionally, a substrate may be biased using radio frequency (RF) power from an RF source. The RF source supplies an RF voltage to a first electrode embedded in an electrostatic chuck (ESC) or cathode. The first electrode is capacitively coupled to the plasma of a processing chamber through a layer of ceramic, which is a part of the ESC. Non-linear, diode-like nature of the plasma sheath results in rectification of the applied RF field, such that a direct-current (DC) voltage drop, or self-bias, appears between the substrate and the plasma. This voltage drop determines the average energy of the ions accelerated towards the substrate.

The ESC secures the substrate disposed thereon by applying a fixed DC voltage to a second electrode embedded in the ESC to establish an electric field between the ESC and the substrate. The electric field induces opposite polarity charges to accumulate on the substrate and the second electrode, respectively. The electrostatic attractive force between the oppositely polarized charges pulls the substrate toward the ESC to secure the substrate. However, the electrostatic force can be affected by the RF bias power supplied to the first electrode in the ESC, leading to under or over clamping of the substrate. In addition, as large bias voltage becomes many kilovolts, the fluctuation of the self-bias voltage with respect to the fixed DC voltage can lead to an increased risk of arcing or sudden de-clamping and breaking of the substrate. This is particularly a problem with very high bias power (kilovolts (kV) range) which is used during pulsed voltage type of substrate biasing techniques.

Therefore, an improved system for biasing and clamping a substrate is needed.

SUMMARY

Embodiments of the disclosure may provide a plasma processing chamber, comprising a substrate support assembly, a waveform generator, a first power delivery line, a clamping network, a signal detection module, and a controller. The substrate support assembly comprises a substrate supporting surface, a first biasing electrode, and a first dielectric layer disposed between the first biasing electrode and the substrate supporting surface. The first power delivery line electrically couples the waveform generator to the first biasing electrode, wherein the first power delivery line comprises a blocking capacitor. The clamping network is coupled to the first power delivery line at a first point between the blocking capacitor and the biasing electrode, the clamping network comprising a direct-current (DC) voltage source coupled between the first point and ground, and a blocking resistor coupled between the first point and an output of the direct-current (DC) voltage source. The signal detection module is configured to receive a first electrical signal from a first signal trace that is coupled to the first power delivery line at a point disposed between the blocking capacitor and the biasing electrode. The controller is configured to communicate with the signal detection module and control a magnitude of a voltage supplied to the first power delivery line at the first point by the direct-current (DC) voltage source due to information received within the received electrical signal.

Embodiments of the disclosure may further provide a plasma processing chamber comprising a substrate support assembly, a waveform generator, a first power delivery line, a clamping network, and a signal detection module. The first power delivery line electrically couples the waveform generator to the first electrode, wherein the first power delivery line comprises a blocking capacitor. The clamping network is coupled to the first power delivery line at a first point between the blocking capacitor and the first electrode, the clamping network comprising a direct-current (DC) voltage source coupled between the first point and ground, and a blocking resistor coupled between the first point and the direct-current (DC) voltage source. The signal detection module is configured to receive a first electrical signal from a first signal trace that is coupled to the first power delivery line at a point disposed between the blocking capacitor and the first electrode.

Embodiments of the disclosure may further provide a method for plasma processing a substrate, comprising: generating a plasma within a processing region of a processing chamber, wherein the processing region comprises a substrate support that comprises a substrate supporting surface, a first biasing electrode, and a first dielectric layer disposed between the first biasing electrode and the substrate supporting surface; delivering, from a waveform generator, a plurality of pulsed-voltage waveforms to the first biasing electrode through a first power delivery line during a first time period, wherein the first power delivery line comprises a blocking capacitor that is disposed between the waveform generator and the biasing electrode; halting the delivery of the plurality of pulsed-voltage waveforms to the first biasing electrode during all of a second time period; applying, from a clamping network, a first clamping voltage to the first biasing electrode; detecting at least one characteristic of one or more of the delivered plurality of pulsed-voltage waveforms during the first time period by receiving an electrical signal from a signal trace that is coupled to the first power delivery line at a first point disposed between the blocking capacitor and the biasing electrode; detecting at least one characteristic of an electrical signal received from the signal trace during the second time period; and adjusting the first clamping voltage applied to the first biasing electrode based on the detected characteristic of the one or more of the delivered plurality of pulsed-voltage waveforms and the at least one characteristic of the electrical signal received from the signal trace during the first and second time periods.

Embodiments of the disclosure may further provide a method for plasma processing a substrate, comprising: generating a plasma within a processing region of a processing chamber, wherein the processing region comprises a substrate support that comprises a substrate supporting surface, a first biasing electrode, and a first dielectric layer disposed between the first biasing electrode and the substrate supporting surface; delivering, from a waveform generator, one or more waveforms to the first biasing electrode through a first power delivery line during a first time period; halting the delivery of the one or more waveforms to the first biasing electrode for a second time period; applying, from a clamping network, a first clamping voltage to the first biasing electrode; detecting at least one characteristic of the one or more waveforms during the first time period by receiving an electrical signal from a signal trace that is coupled to the first power delivery line at a first point disposed on the first power delivery line; detecting at least one characteristic of an electrical signal received from the signal trace during the second time period; and adjusting the first clamping voltage applied to the first biasing electrode based on the detected characteristic of the one or more waveforms received from the signal trace during the first time period; and the detected at least one characteristic of the electrical signal received from the signal trace during the second time period.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 4B-4D illustrate examples of a series of pulse voltage (PV) waveform bursts, according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure provided herein include an apparatus and methods for plasma processing of a substrate in a processing chamber. Aspects of one or more of the embodiments disclosed herein include a system and method of reliably biasing and clamping a substrate during processing to improve the plasma processing results. Embodiments of the disclosure may include an apparatus and method for providing a pulsed-voltage (PV) waveform delivered from one or more pulsed-voltage (PV) generators to one or more electrodes within the processing chamber, while biasing and clamping a substrate during a plasma process. In some embodiments, a radio frequency (RF) generated RF waveform is provided from an RF generator to one or more electrodes within a processing chamber to establish and maintain a plasma within the processing chamber, while PV waveform(s) delivered from a PV generator are configured to establish a nearly constant sheath voltage across the surface of a substrate. The established nearly constant sheath voltage across the surface of a substrate can create a desirable ion energy distribution function (IEDF) at the surface of the substrate during one or more plasma processing steps performed within the processing chamber. In some embodiments, the PV waveform is established by a PV generator that is electrically coupled to a biasing electrode disposed within a substrate support assembly disposed within a plasma processing chamber.

Figure 1A:
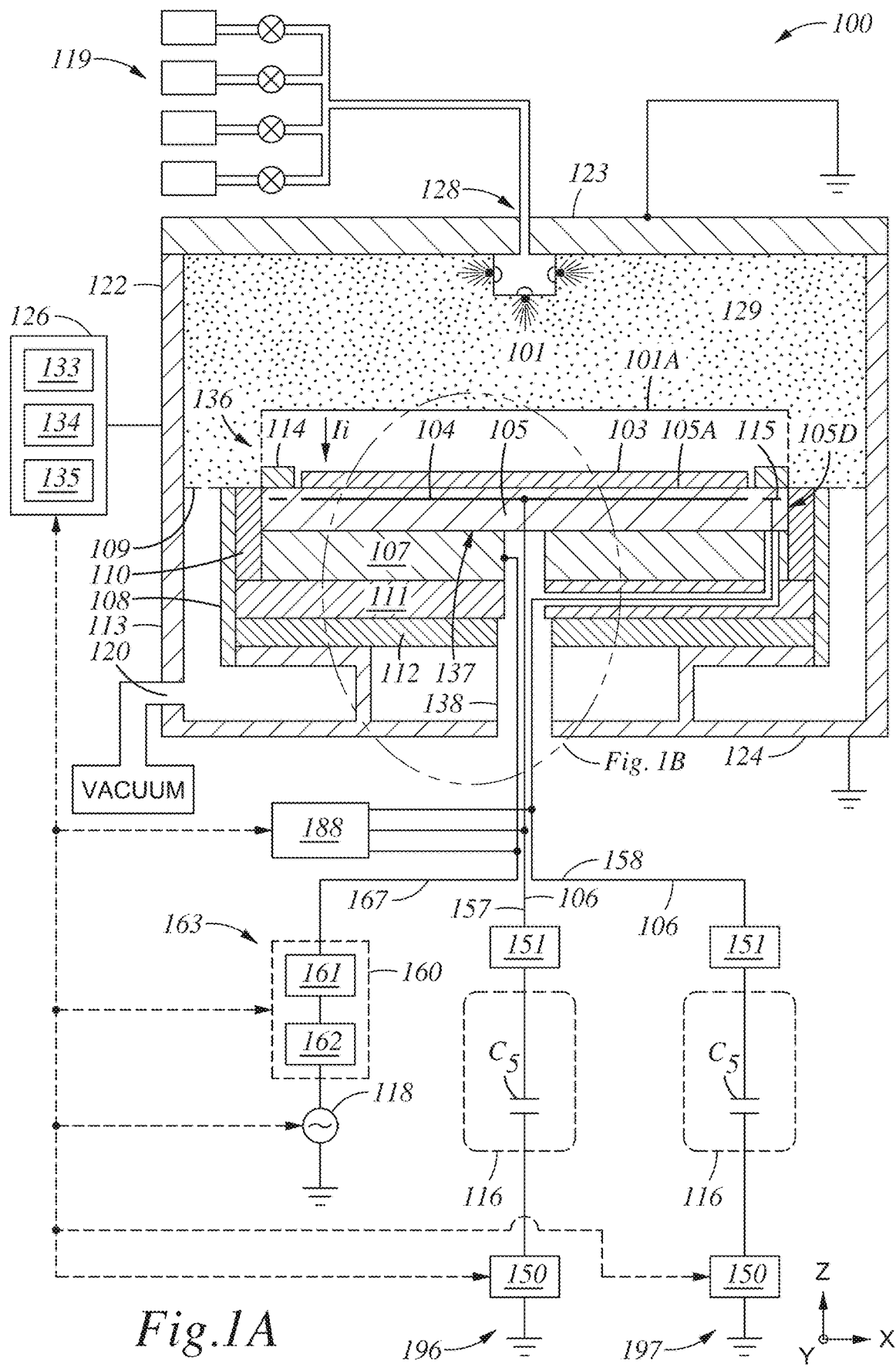
FIG. 1A is a schematic cross-sectional view of a processing chamber configured to practice methods described herein, according to one embodiment.

During some of the plasma processes, ions are purposely accelerated towards the substrate by the voltage drop formed in an electron-repelling sheath that forms over a substrate placed on top of a substrate-support assembly. While not intending to be limiting as to the scope of the disclosure provided herein, the substrate support assembly is often referred to herein as the "cathode assembly" or "cathode". FIG. 1A is a schematic cross-sectional view of a processing chamber 100, in which a plasma 101 is formed during a plasma process that is being performed on a substrate 103. During one or more of the plasma processing methods disclosed herein, an ion-accelerating cathode sheath is generally formed during plasma processing by use of a pulsed-voltage (PV) generator 150 that is configured to establish a pulsed-voltage waveform at a biasing electrode 104 (FIGS. 1A-1B) disposed within a substrate support assembly 136. In some embodiments, the substrate support assembly 136 (FIG. 1A) includes a substrate support 105 and a support base 107. The substrate support 105 can include an electrostatic chuck (ESC) assembly 105D that is configured to "clamp" or "chuck" (e.g., retain) a substrate 103 on a substrate receiving surface 105A. In some embodiments, the biasing electrode 104 forms part of a chucking electrode that is separated from the substrate by a thin layer of a dielectric material 105B (FIG. 1B) formed within the electrostatic chuck (ESC) assembly 105D and optionally an edge control electrode 115 that is disposed within or below an edge ring 114 that surrounds a substrate 103 when the substrate 103 is disposed on the substrate supporting surface 105A of the substrate support assembly 136.

During plasma processing, a vacuum pressure formed in a processing volume 129 of the processing chamber 100 results in poor thermal conduction between surfaces of components disposed therein, such as between the dielectric material of the substrate support 105 and the substrate 103 disposed on the substrate receiving surface 105A, which reduces the substrate support's effectiveness in heating or cooling the substrate 103. Therefore, there is often a need for a thermally conductive inert heat transfer gas, typically helium, to be introduced and maintained at an increased pressure (e.g., backside pressure) within a volume (not shown) disposed between a non-device side surface of the substrate 103 and the substrate receiving surface 105A of the substrate support 105 to improve the heat transfer therebetween. The heat transfer gas, provided by a heat transfer gas source (not shown), flows to the backside volume through a gas communication path (not shown) disposed through the support base 107 and further disposed through the substrate support 105.

Figure 2A:
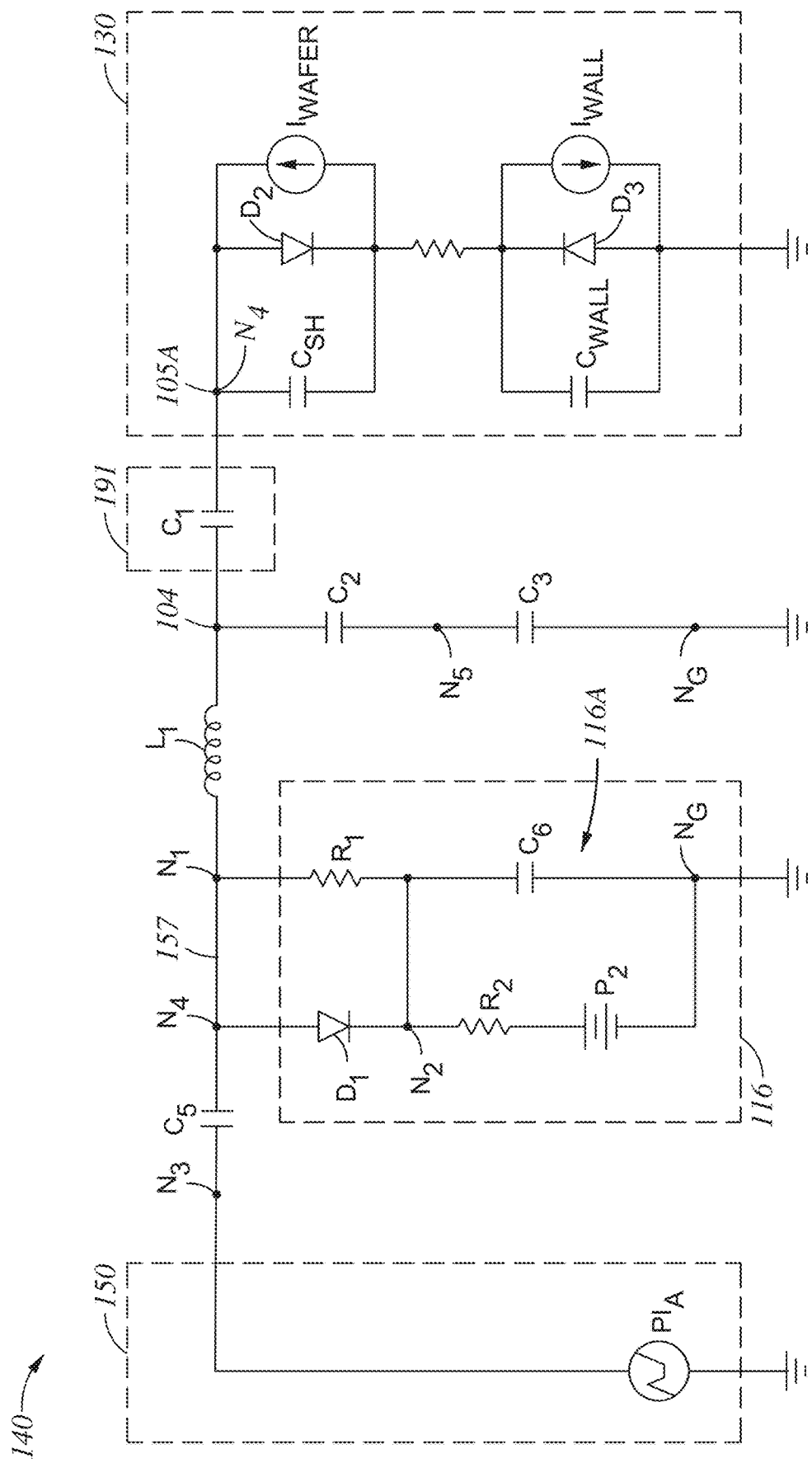
FIG. 2A is a functionally equivalent circuit diagram of a system that can be used to generate negative pulses in a process chamber, according to one embodiment.
Figure 2B:
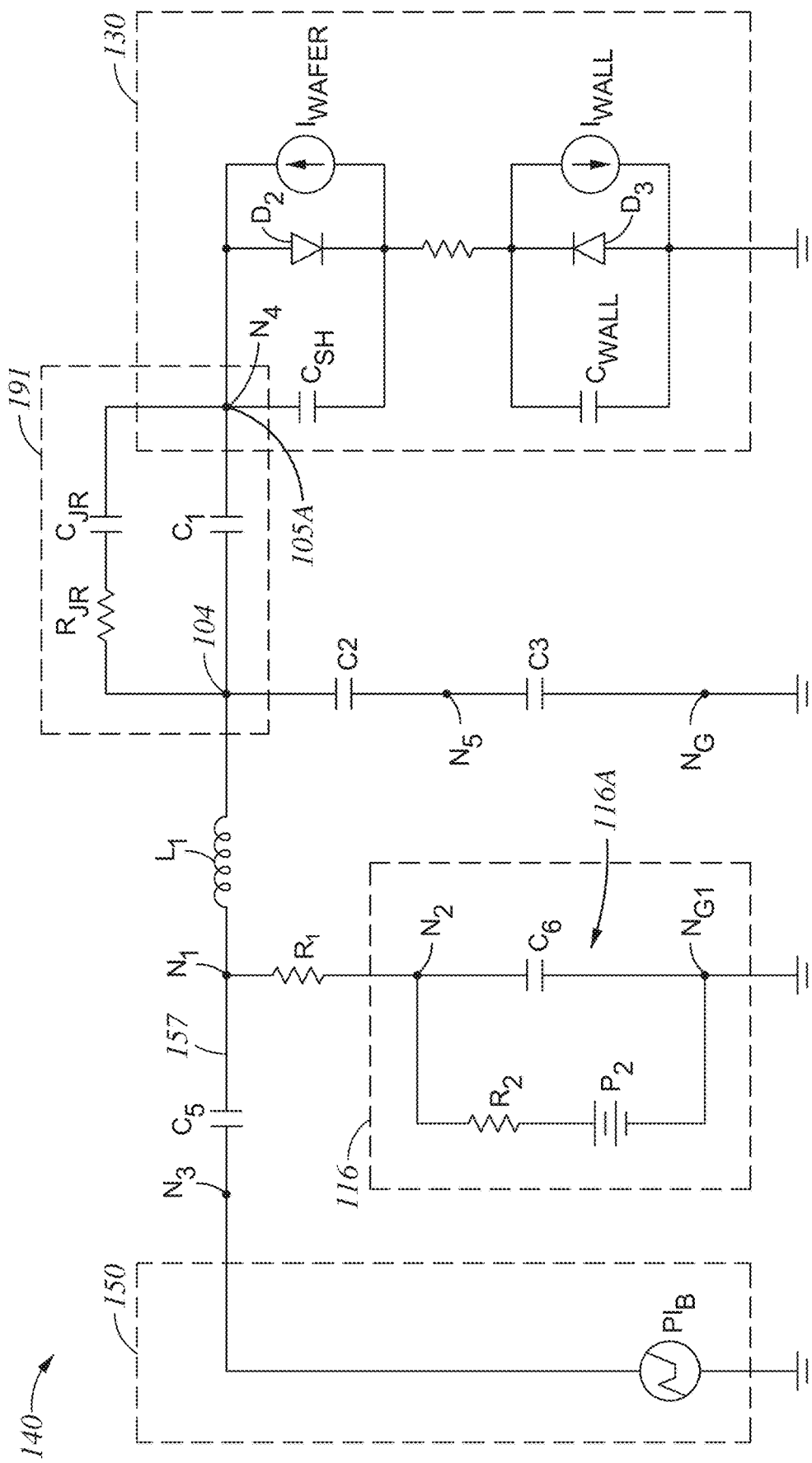
FIG. 2B is a functionally equivalent circuit diagram of a system that can be used to generate positive pulses in a process chamber, according to one embodiment.

In an effort to enable the higher relative pressure to be formed behind the substrate, a clamping voltage is applied to the biasing electrode 104 to "clamp" or "chuck" the substrate 103 to the substrate receiving surface 105A by use of a biasing and clamping network, which is also referred to herein as simply a clamping network 116. In some embodiments, the clamping network 116 includes a DC voltage source $P_2$ (FIGS. 2A-2B), a blocking resistor $R_1$ (FIGS. 2A-2B) and a diode $D_1$ (FIG. 2A), and in some configurations will also include a resistor $R_2$ (FIGS. 2A-2B) and capacitor $C_6$ (FIGS. 2A-2B). The presence of the diode $D_1$ is used to maintain a constant voltage difference between the waveform established at the biasing electrode 104 and the waveform established at the substrate surface. In some embodiments, the PV generator 150 and the clamping network 116 are connected in parallel. The clamping network 116 automatically adjusts a clamping voltage applied to the biasing electrode 104 to maintain a clamping voltage at a desired clamping voltage level to improve the plasma processing process results achieved on the substrate 103 and to assure that a clamped substrate 103 is not damaged during processing, due to the application of too large of a clamping voltage or applying a clamping voltage that is too small. The application of too large of a clamping voltage can increase the "de-chucking" time (e.g., time it takes for charge formed in the substrate to dissipate to reduce the attraction of the substrate 103 to the substrate receiving surface 105A) and/or cause the substrate to break due to the application of too large of a "clamping" or "chucking force" to the substrate 103 and/or cause the thin dielectric between substrate backside and the clamping electrode 104 to breakdown. The application of a clamping voltage that is too small can cause the substrate 103 to lose close contact with the substrate receiving surface 105A during processing. The backside helium can leak into the plasma chamber and plasma species can also leak into a position at the substrate backside, causing abrupt pressure and gas composition change at substrate backside. Such abrupt change can ignite plasma at substrate backside, damaging the substrate and the electrostatic chuck.

The plasma potential of the plasma 101 formed in the processing region 129 varies due to the application of a pulsed voltage (PV) or RF bias to one or more electrodes disposed within a plasma processing chamber. As is discussed further below, to reliably generate a desired clamping voltage $V_{DCV}$ during a plasma process, the variations in the plasma potential need to be accounted for when controlling a clamping voltage applied to a clamping electrode and substrate 103 during processing. In one example, variations in the plasma potential will occur within each pulse of a multiple pulse PV waveform, and also as the characteristics of PV waveforms delivered by a PV generator 150 change as pulsed voltage biasing parameters applied to a biasing electrode are altered within a substrate-processing-recipe, or from substrate-processing-recipe to substrate-processing-recipe, used to process one or more substrates in the processing chamber. Conventional substrate clamping systems (e.g., electrostatic chucks) that provide a constant clamping voltage and do not take into account and adjust for the fluctuations in the plasma potential often provide poor plasma processing results and/or damage the substrate during processing.

However, the ability to reliably measure or determine in real time the variations in the plasma potential so that they can be accounted for during processing is not a trivial task. The ability to reliably measure the fluctuations or variations in the plasma potential so that the clamping voltage can be desirably adjusted in a production worthy plasma processing chamber that is able to sequentially process multiple substrates in a row is an additional challenge. Conventional methods of measuring the plasma potential and the substrate DC bias requires the use of a probe to directly measure substrate surface potential, are good for non-production laboratory testing, but their presence in the chamber can affect the plasma processing results. The conventional methods of estimating the plasma potential and the substrate DC bias are complicated and require the use of one or more models to correlate the directly measured substrate surface DC bias with the voltage, current and phase data to be measured at an RF match at a few calibration conditions, and use that model to estimate the plasma potential and substrate DC bias when used in production device fabrication processes. The apparatus and methods described herein can be used to reliably determine the plasma potential as a function of time and then provide adjustments to the clamping voltage based on the measured plasma potential.

Plasma Processing Chamber Example

Figure 1B:
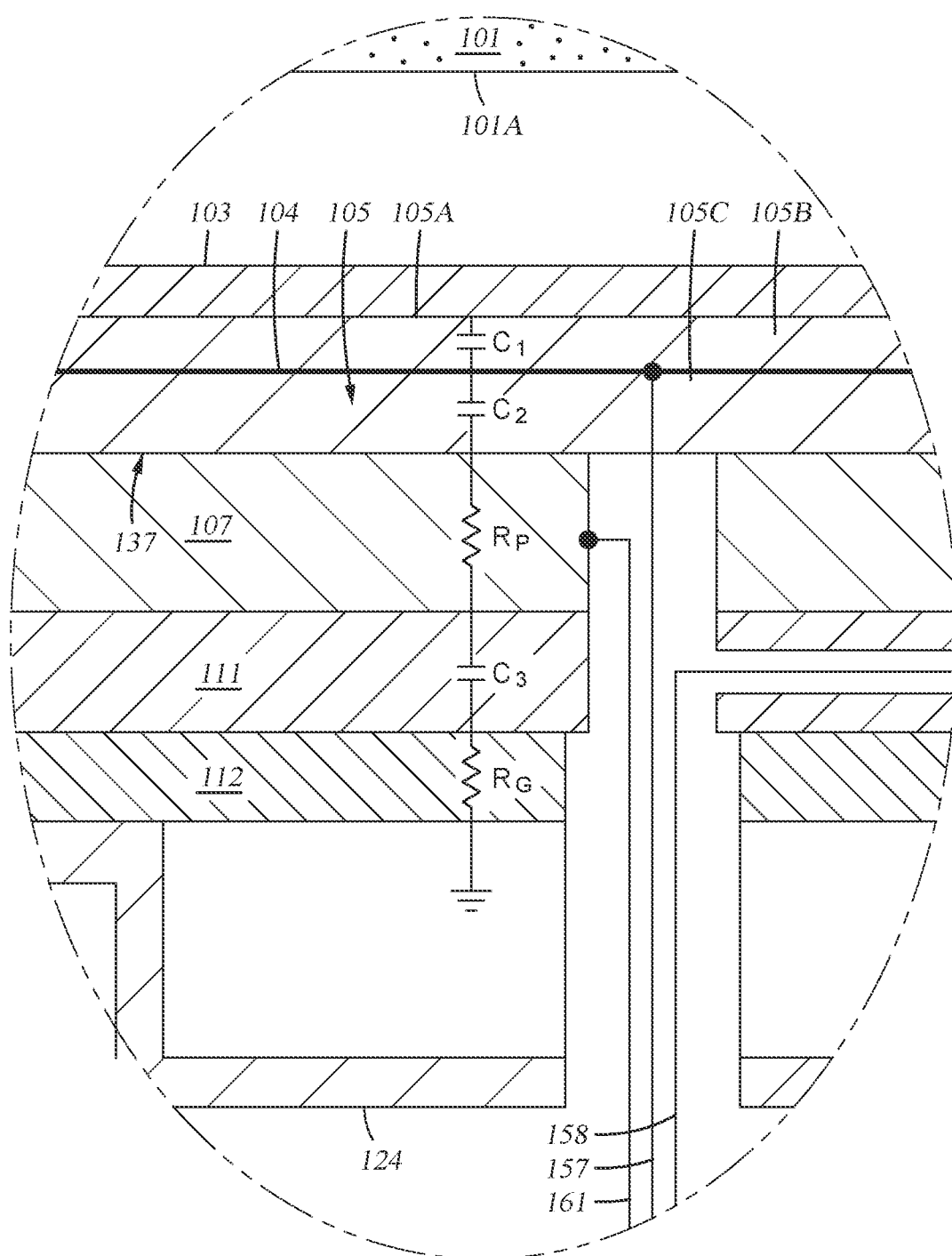
FIG. 1B is a close-up schematic cross-sectional view of a portion of the processing chamber illustrated in FIG. 1A, according to one embodiment.

FIG. 1A illustrates the processing chamber 100, in which a complex load 130 (FIGS. 2A-2B) is formed during plasma processing. FIG. 1B is a close-up schematic cross-sectional view of a portion of the substrate support assembly 136 illustrated in FIG. 1A, according to one embodiment. In general, the process chamber 100 is configured to utilize one or more PV generators 150 and/or one or more RF generators 118 to generate, control and maintain a plasma 101 in the processing volume 129 during plasma processing. FIGS. 2A and 2B illustrate different configurations of an electrical circuit, or system, that is configured to deliver a plurality of voltage pulses, provided from the PV generator 150, to the biasing electrode 104 disposed in the plasma processing chamber 100. The PV waveform generator 150 illustrated in FIGS. 2A and 2B is disposed within a first PV source assembly 196 (FIG. 1A) disposed within the processing chamber 100.

The processing chamber 100 is configured to practice one or more of the biasing schemes proposed herein, according to one or more embodiments. In one embodiment, the processing chamber 100 is a plasma processing chamber, such as a reactive ion etch (RIE) plasma chamber. In some other embodiments, the processing chamber 100 is a plasma-enhanced deposition chamber, for example a plasma-enhanced chemical vapor deposition (PECVD) chamber, a plasma enhanced physical vapor deposition (PEPVD) chamber, or a plasma-enhanced atomic layer deposition (PEALD) chamber. In some other embodiments, the processing chamber 100 is a plasma treatment chamber, or a plasma based ion implant chamber, for example a plasma doping (PLAD) chamber. In some embodiments, the plasma source is a capacitively coupled plasma (CCP) source, which includes an electrode (e.g., chamber lid 123) disposed in the processing volume 129 facing the substrate support assembly 136. As illustrated in FIG. 1A, an opposing electrode, such as the chamber lid 123, which is positioned opposite to the substrate support assembly 136, is electrically coupled to ground. However, in other alternate embodiments, the opposing electrode is electrically coupled to an RF generator. In yet other embodiments, the processing chamber 100 may alternately, or additionally, include an inductively coupled plasma (ICP) source electrically coupled to a radio frequency (RF) power supply.

The processing chamber 100 also includes a chamber body 113 that includes the chamber lid 123, one or more sidewalls 122, and a chamber base 124, which define the processing volume 129. The one or more sidewalls 122 and chamber base 124 generally include materials that are sized and shaped to form the structural support for the elements of the processing chamber 100, and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel. A gas inlet 128 disposed through the chamber lid 123 is used to provide one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103. Herein, the substrate 103 is transferred to and from the substrate receiving surface 105A of the substrate support 105 using a lift pin system (not shown).

The processing chamber 100 further includes a system controller 126, which is also referred to herein as a processing chamber controller. The system controller 126 herein includes a central processing unit (CPU) 133, a memory 134, and support circuits 135. The system controller 126 is used to control the process sequence used to process the substrate 103 including the substrate biasing methods described herein. The CPU 133 is a general purpose computer processor configured for use in an industrial setting for controlling processing chamber and sub-processors related thereto. The memory 134 described herein, which is generally non-volatile memory, may include random access memory, read only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing chamber 100. Preferably, the program, which is readable by CPU 133 in the system controller 126, includes code, which when executed by the processor (CPU 133), perform tasks relating to the monitoring and execution of the electrode biasing scheme described herein. The program will include instructions that are used to control the various hardware and electrical components within the processing chamber 100 to perform the various process tasks and various process sequences used to implement the electrode biasing scheme and method of reliably biasing and clamping a substrate during a plasma process, which are described herein. In one embodiment, the program includes instructions that are used to perform one or more of the operations described below in relation to FIGS. 6A-6B.

In some embodiments, an RF source assembly 163, which includes an RF generator 118 and an RF generator assembly 160, is generally configured to deliver a desired amount of a continuous wave (CW) or pulsed RF power at a desired substantially fixed sinusoidal waveform frequency to the support base 107 based on control signals provided from the controller 126. During processing, the RF source assembly 163 is configured to deliver RF power to the support base 107 disposed proximate to the substrate support 105, and within the substrate support assembly 136. The RF power delivered to the support base 107 is configured to ignite and maintain a processing plasma 101 formed by use of processing gases disposed within the processing volume 129. In some embodiments, the support base 107 is an RF electrode that is electrically coupled to the RF generator 118 via an RF matching circuit 162 and a first filter assembly 161, which are both disposed within the RF generator assembly 160. The first filter assembly 161 includes one or more electrical elements that are configured to substantially prevent a current generated by the output of the PV waveform generator 150 from flowing through an RF power delivery line 167 and damaging the RF generator 118. The first filter assembly 161 acts as a high impedance (e.g., high Z) to the PV signal generated from a PV pulse generator $P_1$ within the PV waveform generator 150, and thus inhibits the flow of current to the RF matching circuit 162 and RF generator 118.

In some embodiments, the plasma generator assembly 160 and RF generator 118 are used to ignite and maintain a processing plasma 101 using the processing gases disposed in the processing volume 129 and fields generated by the RF power provided to the support base 107 by the RF generator 118. The processing volume 129 is fluidly coupled to one or more dedicated vacuum pumps, through a vacuum outlet 120, which maintain the processing volume 129 at sub-atmospheric pressure conditions and evacuate processing and/or other gases, therefrom. The substrate support assembly 136, disposed in the processing volume 129, is disposed on a support shaft 138 that is grounded and extends through the chamber base 124. However, in some embodiments, the RF generator assembly 160 is configured to deliver RF power to the biasing electrode 104 disposed in the substrate support 105 versus the support base 107.

The substrate support assembly 136, as briefly discussed above, generally includes the substrate support 105 (e.g., ESC substrate support) and support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing. In some embodiments, the support base 107 includes one or more cooling channels (not shown) disposed therein that are fluidly coupled to, and in fluid communication with, a coolant source (not shown), such as a refrigerant source or water source having a relatively high electrical resistance. In some embodiments, the substrate support 105 includes a heater (not shown), such as a resistive heating element embedded in the dielectric material thereof. Herein, the support base 107 is formed of a corrosion resistant thermally conductive material, such as a corrosion resistant metal, for example aluminum, an aluminum alloy, or a stainless steel and is coupled to the substrate support with an adhesive or by mechanical means.

Typically, the substrate support 105 is formed of a dielectric material, such as a bulk sintered ceramic material, such as a corrosion resistant metal oxide or metal nitride material, for example aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the biasing electrode 104 embedded in the dielectric material thereof. In one configuration, the biasing electrode 104 is a chucking pole used to secure (i.e., chuck) the substrate 103 to the substrate receiving surface 105A of the substrate support 105 and to bias the substrate 103 with respect to the processing plasma 101 using one or more of the pulsed-voltage biasing schemes described herein. Typically, the biasing electrode 104 is formed of one or more electrically conductive parts, such as one or more metal meshes, foils, plates, or combinations thereof.

The biasing electrode 104 within the electrostatic chuck (ESC) is electrically coupled to the biasing and clamping network 116, which are illustrated in FIGS. 1A and 2A-2B. The biasing and clamping network 116 includes the DC voltage source $P_2$. The clamping network 116 automatically maintains a clamping voltage, which is a constant voltage drop across the biasing electrode 104 and the substrate 103 when a plurality PV waveforms are applied to the biasing electrode 104 by the pulsed-voltage waveform generator (PVWG) 150 during plasma processing, leading to improved clamping of the substrate 103. The clamping network 116 is described further below in conjunction with FIGS. 2A-4C. In some embodiments, the clamping network 116 is configured to provide a chucking voltage to the biasing electrode 104, such as static DC voltage between about −10,000 Volts (V) and about 10,000 V, such as −3,000 Volts (V) and about 3,000 V during processing.

Referring to FIG. 1A, the substrate support assembly 136 may further include the edge control electrode 115 that is positioned below the edge ring 114 and surrounds the biasing electrode 104 so that when biased, due to its position relative to the substrate 103, it can affect or alter a portion of the generated plasma 101 that is at or outside of the edge of the substrate 103. The edge control electrode 115 can be biased by use of a pulsed-voltage waveform generator (PVWG) 150 that is different from the pulsed-voltage waveform generator (PVWG) 150 that is used to bias the biasing electrode 104. In some embodiments, the edge control electrode 115 can be biased by use of a pulsed-voltage waveform generator (PVWG) 150 that is also used to bias the biasing electrode 104 by splitting part of the power to the edge control electrode 115. In one configuration, a first PV waveform generator 150 of the first PV source assembly 196 is configured to bias the biasing electrode 104, and a second PV waveform generator 150 of a second PV source assembly 197 is configured to bias the edge control electrode 115. In one embodiment, the edge control electrode 115 is positioned within a region of the substrate support 105, as shown in FIG. 1A. In general, for a processing chamber 100 that is configured to process circular substrates, the edge control electrode 115 is annular in shape, is made from a conductive material and configured to surround at least a portion of the biasing electrode 104, as shown in FIG. 1A. In some embodiments, as illustrated in FIG. 1A, the edge control electrode 115 includes a conductive mesh, foil or plate that is disposed a similar distance (i.e., Z-direction) from the surface 105A of the substrate support 105 as the biasing electrode 104. In some other embodiments, the edge control electrode 115 includes a conductive mesh, foil or plate that is positioned on or within a region of a quartz pipe 110, which surrounds at least a portion of the biasing electrode 104 and/or the substrate support 105. Alternately, in some other embodiments, the edge control electrode 115 is positioned within or is coupled to the edge ring 114, which is disposed adjacent to the substrate support 105. In this configuration, the edge ring 114 is formed from a semiconductor or dielectric material (e.g., AlN, etc.).

Referring to FIG. 1A, the second PV source assembly 197 includes a clamping network 116 so that a bias applied the edge control electrode 115 can be similarly configured to the bias applied to the biasing electrode 104 by the clamping network 116 coupled within the first PV source assembly 196. Applying similarly configured PV waveforms and clamping voltages to the biasing electrode 104 and edge control electrode 115 can help improve the plasma uniformity across the surface of the substrate during processing and thus improve the plasma processing process results. While, for simplicity of discussion, the various methods described herein primarily discuss methods used to determine a desirable clamping voltage $V_{DCV}$ or DC bias voltage (e.g., equation (15) and/or (16)) that is to be applied to the biasing electrode 104, this discussion is not intended to be limiting as to the scope of the disclosure provided herein since one or more of the operations or methods described herein could also be used to determine and control the bias that is to be applied by the clamping network 116 of the second PV source assembly 197 to the edge control electrode 115. In one example, the operations disclosed in relation to FIGS. 6A-6B could be simultaneously applied to the biasing electrode 104 and edge control electrode 115 during plasma processing.

In some embodiments, the processing chamber 100 further includes the quartz pipe 110, or collar, that at least partially circumscribes portions of the substrate support assembly 136 to prevent the substrate support 105, and/or the support base 107, from contact with corrosive processing gases or plasma, cleaning gases or plasma, or byproducts thereof. Typically, the quartz pipe 110, the insulator plate 111, and the ground plate 112 are circumscribed by a liner 108. In some embodiments, a plasma screen 109 is positioned between the cathode liner 108 and the sidewalls 122 to prevent plasma from forming in a volume underneath the plasma screen 109 between the liner 108 and the one or more sidewalls 122.

FIG. 1B is a close-up view of the substrate support assembly 136 that includes a simplified electrical schematic representation of the electrical characteristics of the various structural elements within one or more embodiments of the substrate support assembly 136. The substrate support assembly 136 includes the substrate support 105, the support base 107, the insulator plate 111 and the ground plate 112, which will each be discussed in turn.

Figure 1C:
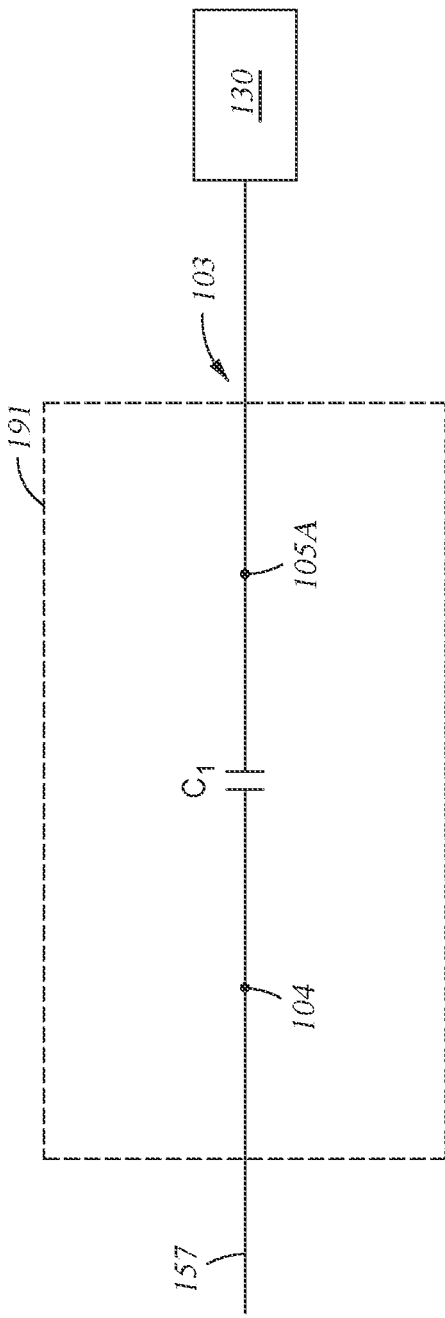
FIG. 1C is a functionally equivalent circuit diagram of a coulombic electrostatic chuck (ESC) that can be used in the process chamber illustrated in FIG. 1A, according to one embodiment.
Figure 1D:
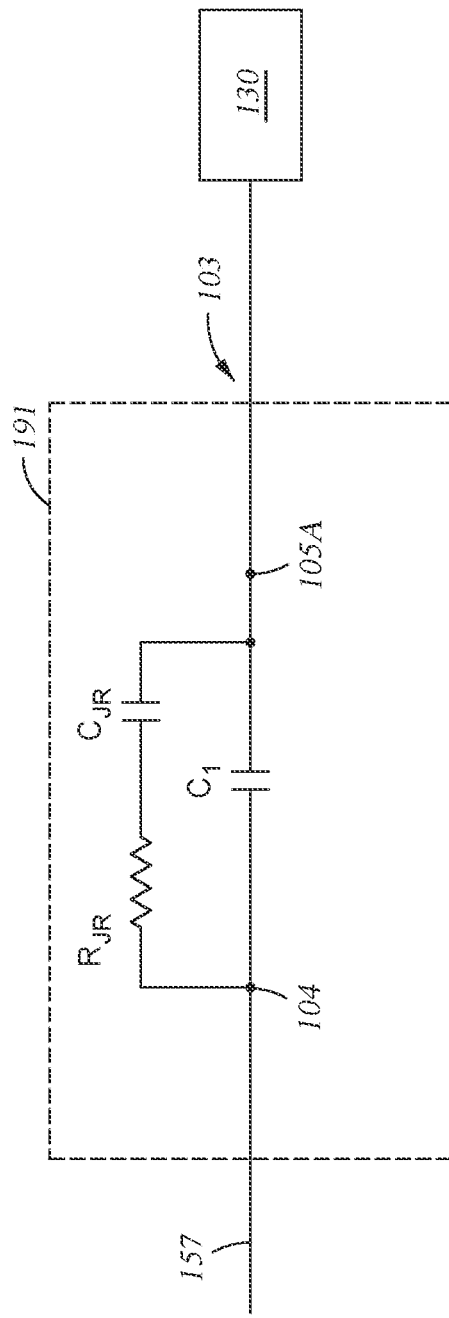
FIG. 1D is a functionally equivalent circuit diagram of a Johnsen-Rahbek electrostatic chuck (ESC) that can be used in the process chamber illustrated in FIG. 1A, according to one embodiment.

Structurally, in an electrostatic chuck (ESC) 191 version of the substrate support 105, the biasing electrode 104 is spaced apart from the substrate receiving surface 105A of the substrate support 105 by the layer of dielectric material 105B. Typically, electrostatic chucks (ESC) 191 can be categorized into two main classes of electrostatic chucks, which are known as a coulombic ESC or a Johnsen-Rahbek ESC. Depending on the type of electrostatic chuck 191, such as the coulombic ESC or the Johnsen-Rahbek ESC, the effective circuit elements used to describe the electrical coupling of the biasing electrode 104 to the plasma 101 will have some differences. FIG. 1C is a functionally equivalent circuit diagram of a coulombic ESC that can be used in the process chamber illustrated in FIG. 1A, according to one embodiment. FIG. 1D is a functionally equivalent circuit diagram of a Johnsen-Rahbek ESC that can be used in the process chamber illustrated in FIG. 1A, according to one embodiment.

In the simplest case, such as the coulombic ESC case, the dielectric layer 105B will include a capacitance $C_1$ as shown in FIGS. 1B-1C, 2A and 3B. Typically, the layer of dielectric material 105B (e.g., aluminum oxide ($Al_2O_3$), etc.) has a thickness between about 0.1 mm and about 1 mm, such as between about 0.1 mm and about 0.5 mm, for example about 0.3 mm. In some embodiments, the dielectric material and layer thickness can be selected so that the capacitance $C_1$ of the layer of dielectric material is between about 5 nF and about 100 nF, such as between about 7 and about 20 nF, for example.

In a more complex case, such as the Johnsen-Rahbek ESC case, the circuit model includes a capacitance $C_1$ that is coupled in parallel with a dielectric material resistance $R_{JR}$ and gap capacitance $C_{JR}$ as shown in FIG. 1D. In the case of a "Johnsen-Rahbek ESC", the ESC dielectric layer is "leaky", in that it is not a perfect insulator and has some conductivity, since, for example, the dielectric material may be a doped aluminum nitride (AlN) having a permittivity ($\varepsilon$) of about 9. Same as for the Coulombic chuck, there is a direct capacitance $C_1$ between the electrode 104 and the substrate 103 through the thin dielectric 105B and the gap filled with helium. The volume resistivity of the dielectric layer within a Johnsen-Rahbek ESC is less than about $10^{12}$ ohms-cm ($\Omega$-cm), or less than about $10^{10}$ $\Omega$-cm, or even in a range between $10^8$ $\Omega$-cm and $10^{12}$ $\Omega$-cm, and thus the layer of dielectric material 105B can have a dielectric material resistance $R_{JR}$ in a range between $10^6$-$10^{11}$ $\Omega$s. Since a gap is typically formed between the substrate support surface 105A and a surface of the substrate 103 a gap capacitance $C_{JR}$ is used to account for the gas containing spaces between the substrate 103 and substrate support surface 105A. It is expected that the gap capacitance $C_{JR}$ has a capacitance a bit larger than the capacitance $C_1$.

For ease of discussion, since the substrate 103 is typically made out of a semiconductor material and/or dielectric material with a thin layer of intrinsic dielectric layer on the bottom and top surfaces, the bottom dielectric layer of the substrate 103 can be considered to be electrically a part of the dielectric layer disposed between the biasing electrode 104 and the substrate receiving surface 105A. Thus, in some applications, the effective capacitance $C_E$ (not shown) formed between the biasing electrode 104 and the top surface of the substrate 103 can be approximated by the combined series capacitance of the dielectric material 105B and the substrate bottom layer (i.e., substrate capacitance $C_{sub}$ (FIG. 1B)). In the coulombic chuck case, since the substrate capacitance $C_{sub}$ is typically very large (>100 nF), or the substrate may be conductive (infinite capacitance), the series capacitance is dominated by the capacitance $C_1$. In the Johnsen-Rahbek ESC case, assuming the substrate capacitance $C_{sub}$ is typically very large, the effective capacitance for clamping the substrate, $C_E$ will be dominated by the gap capacitance $C_{JR}$ for DC clamping voltage (FIG. 1D). The finite resistance of the top dielectric 105B results in a resistance $R_{JR}$ in series with the gap capacitance $C_{JR}$, the two of which are in parallel with the direct coupling $C_1$ between the electrode 104 and the substrate 103. $C_1$ is the capacitance that couples the RF frequency voltage from the electrode 104 to the substrate 103 during plasma processing.

Referring back to FIG. 1B, the electrical schematic representation of the circuit formed within the substrate support assembly 136 includes a support base dielectric layer capacitance $C_2$, which represents the capacitance of the dielectric layer positioned between the support base 107 and the biasing electrode 104. In some embodiments, the thickness of the portion of the dielectric material 105C disposed between the support base 107 and the biasing electrode 104 is greater than the thickness of the dielectric material 105B disposed between the biasing electrode 104 and the substrate 103. In some embodiments, the dielectric materials used to form the dielectric layers on either side of the biasing electrode are the same material and form the structural body of the substrate support 105. In one example, the thickness of the dielectric material 105C (e.g., $Al_2O_3$ or AlN), as measured in a direction extending between the support base 107 and the biasing electrode 104, is greater than 1 mm, such as having a thickness between about 1.5 mm and about 100 mm. The support base dielectric layer capacitance $C_2$ will typically have a capacitance between about 0.5 and about 10 nanofarads (nF).

The electrical schematic representation of the circuit formed within the substrate support assembly 136 also includes a support base resistance $R_P$, an insulator plate capacitance $C_3$, and ground plate resistance $R_G$ that is coupled to ground on one end. Since the support base 107 and ground plate 111 are typically formed from a metal material the support base resistance $R_P$ and ground plate resistance $R_G$ are quite low, such as less than a few milliohms. The insulator plate capacitance $C_3$ represents the capacitance of the dielectric layer positioned between the bottom surface of the support base 107 and the top surface of the ground plate 112. In one example, the insulator plate capacitance $C_3$ has a capacitance between about 0.1 and about 1 nF.

Referring back to FIG. 1A, a PV waveform is provided to the biasing electrode 104 by the PV waveform generator 150 of the first PV source assembly 196 and a PV waveform is provided to the edge control electrode 115 by the PV waveform generator 150 of the second PV source assembly 197. The pulsed voltage waveforms provided to the load (e.g., the complex load 130) disposed within the processing chamber 100. The PV waveform generators 150 include a PV generator P1, such as PV generator $P1_A$ in FIG. 2A or PV generator $P1_B$ in FIG. 2B, that is coupled to the biasing electrode 104 through a power delivery line 157. While not intending to be limiting as to the scope of the disclosure provided herein, and to simplify the discussion, the components within the RF assembly (e.g., RF generator assembly 160 and RF generator 118) and the second PV source assembly 197 are not schematically shown in FIGS. 2A and 2B. The overall control of the delivery of the PV waveform from each of the PV waveform generators 150 is controlled by use of signals provided from the controller 126. In one embodiment, as illustrated in FIGS. 2A and 2B, a PV waveform generator 150 is configured to output a periodic voltage function at time intervals of a predetermined length by use of a signal from a transistor—transistor logic (TTL) source. The periodic voltage function can be two-states DC pulses between a predetermined negative or positive voltage and zero. In one embodiment, a PV waveform generator 150 is configured to maintain a predetermined, substantially constant negative voltage across its output (i.e., to ground) during regularly recurring time intervals of a predetermined length, by repeatedly closing and opening one or more switches at a predetermined rate. In one example, during a first phase of a pulse interval a first switch is used to connect a high voltage supply to the biasing electrode 104, and during a second phase of the pulse interval a second switch is used to connect the biasing electrode 104 to ground. In another embodiment, as illustrated in FIG. 2B, the PV waveform generator 150 is configured to maintain a predetermined, substantially constant positive voltage across its output (i.e., to ground) during regularly recurring time intervals of a predetermined length, by repeatedly closing and opening its internal switch (not shown) at a predetermined rate. In one configuration of the embodiment shown in FIG. 2B, during a first phase of a pulse interval a first switch is used to connect the biasing electrode 104 to ground, and during a second phase of the pulse interval a second switch is used to connect a high voltage supply to the biasing electrode 104. In an alternate configuration of the embodiment shown in FIG. 2B, during a first phase of a pulse interval a first switch is positioned in an open state, such that the biasing electrode 104 is disconnected from the high voltage supply and the biasing electrode 104 is coupled to ground through an impedance network (e.g., inductor and resistor connected in series). Then, during a second phase of the pulse interval the first switch is positioned in a closed state to connect the high voltage supply to the biasing electrode 104, while the biasing electrode 104 remains coupled to ground through the impedance network.

In FIGS. 2A-2B, the PV waveform generators 150 have been reduced to a minimal combination of the components that are important for understanding of its role in establishing a desired pulsed voltage waveform at the biasing electrode 104. Each PV waveform generator 150 will include a PV generator $P1_A$ or $P1_B$ and one or more electrical components, such as but not limited to high repetition rate switches (not shown), capacitors (not shown), inductors (not shown), fly back diodes (not shown), power transistors (not shown) and/or resistors (not shown), that are configured to provide a PV waveform to an output. An actual PV waveform generator 150, which can be configured as a nanosecond pulse generator, may include any number of internal components and may be based on a more complex electrical circuit than what is illustrated in FIGS. 2A-2B. The schematic diagrams of FIGS. 2A-2B are each provided to help explain the fundamental principle of operation of the PV waveform generator, its interaction with the plasma in the processing volume, and its role in establishing a pulsed voltage waveform, such as the pulsed voltage waveform 301 in FIG. 3A or pulsed waveform 401 in FIG. 4A, at the biasing electrode 104.

The power delivery line 157 (FIGS. 1A-1B), electrically connects the output of the PV waveform generator 150 to an optional filter assembly 151 and the biasing electrode 104. While the discussion below primarily discusses the power delivery line 157 of the first PV source assembly 196, which is used to couple a PV waveform generator 150 to the biasing electrode 104, the power delivery line 158 of the second PV source assembly 197, which couples a PV waveform generator 150 to the edge control electrode 115, will include the same or similar components. In FIGS. 2A and 2B, the output of the PV waveform generator 150 is provided to a node $N_3$. The electrical conductor(s) within the various parts of the power delivery line 157 may include: (a) a coaxial transmission line (e.g., coaxial line 106), which may include a flexible coaxial cable that is connected in series with a rigid coaxial transmission line, (b) an insulated high-voltage corona-resistant hookup wire, (c) a bare wire, (d) a metal rod, (e) an electrical connector, or (f) any combination of electrical elements in (a)-(e). The power delivery line 157, such as the portion of power delivery line 157 within the support shaft 138 (FIG. 1A) and the biasing electrode 104, will have some combined stray capacitance $C_{stray}$ (not shown) to ground. The optional filter assembly 151 includes one or more electrical elements that are configured to substantially prevent a current generated by the output of the RF generator 118 from flowing through the power delivery line 157 and damaging the PV waveform generator 150. The optional filter assembly 151 acts as a high impedance (e.g., high Z) to RF signal generated by the RF generator 118, and thus inhibits the flow of current to the PV waveform generator 150.

In some embodiments, as shown in FIGS. 1A and 2A-2B, the PV waveform generator 150 of the first PV source assembly 196 is configured to provide a pulsed voltage waveform signal to the biasing electrode 104, and eventually the complex load 130, by delivering the generated pulsed voltage waveforms through node $N_3$ and the blocking capacitor $C_5$, the filter assembly 151, high-voltage line inductance Li, and capacitance $C_1$. The PV waveform generator 150 is connected between a ground node NG and node $N_3$. The capacitor $C_5$ is further connected between the node $N_3$ and a node $N_1$ at which the clamping network 116 is attached. The clamping network 116 is connected between the node $N_1$ and a ground node NG. In one embodiment, as shown in FIG. 2A, the clamping network 116 includes at least a diode $D_1$, a capacitor $C_6$, a DC voltage source $P_2$, a current-limiting resistor $R_2$, and a blocking resistor $R_1$. In this configuration, the diode $D_1$ and the blocking resistor $R_1$ are connected between the node $N_1$ and a node $N_2$, and the capacitor $C_6$ and the DC voltage source $P_2$, which is in series with the current-limiting resistor $R_2$, are connected between the node $N_2$ and a ground node NG. In another embodiment, as shown in FIG. 2B, the clamping network 116 includes a capacitor $C_6$, a DC voltage source $P_2$, a resistor $R_2$, and a blocking resistor $R_1$. In this configuration, the blocking resistor $R_1$ is connected between the node $N_1$ and a node $N_2$, and the capacitor $C_6$ and the DC voltage source $P_2$, which is in series with the current-limiting resistor $R_2$, are connected between the node $N_2$ and a ground node NG. In general, the DC voltage source $P_2$ is used to establish an output voltage of the clamping network 116, which is a voltage difference across the capacitor $C_6$.

The clamping network 116, when used in combination, as shown in FIGS. 2A and 2B, forms a current suppressing/ filtering circuit for the PV waveforms from the PV generator, so that PV waveforms do not induce a significant current through the clamping network 116 to ground. The effect of the clamping network 116 on the operation of the PV generator P1$_A$(FIG. 2A) or the PV generator P1$_B$(FIG. 2B) can be made negligible by selecting an appropriately large blocking capacitor C$_5$ and blocking resistor R$_1$. The blocking resistor R$_1$ schematically illustrates a resistor positioned within the components connecting the clamping network 116 to a point within the power delivery line 157, such as node N$_1$. The main function of the blocking capacitor C$_5$ is to protect the PV pulse generator P1$_A$ from the DC voltage produced by the DC voltage source P$_2$, which thus drops across blocking capacitor C$_5$ and does not perturb the PV waveform generator's output. The value of blocking capacitor C$_5$ is selected such that while blocking only the DC voltage generated by the DC voltage source P$_2$, it creates a negligible impedance to the pulsed bias generator's pulsed voltage output provided to node N$_3$ so that most of the pulsed voltage is delivered to the complex load 130. By selecting a sufficiently large blocking capacitor C$_5$ capacitance (e.g., 10-80 nF), the blocking capacitor C$_5$ is nearly transparent for a 400 kHz PV waveform signal, which is generated by the PV waveform generator 150 for example, in that it is much bigger than any other relevant capacitance in the system and the voltage drop across this element is very small compared to that across other relevant capacitors, such as sheath capacitance C$_{SH}$ and C$_{WALL}$ (FIGS. 2A-2B) coupled in parallel to diode D$_2$ and D$_3$, respectively.

Referring to FIGS. 2A-2B, the purpose of the blocking resistor R$_1$ in the clamping network 116 is to block the generated pulsed voltage by the PV waveform generator 150 enough to minimize the current it induces in the DC voltage supply P$_2$. This blocking resistor R$_1$ is sized to be large enough to efficiently minimize the current (i$_1$) through it. For example, a resistance of ≤200 kOhm, such as greater than 1 MOhm, or greater than 10 MOhms, or even in a range between 200 kOhms and 50 MOhms is used to make a current generated from the delivery of 400 kHz pulsed voltage signal to node N$_1$ by the PV waveform generator 150 into the clamping network 116 negligible. The average induced DC current is desirably less than about 40 mA, such as less than 30 mA, or less than 20 mA, or less than 10 mA, or less than 5 mA, or even between 1 µA-20 mA.

In some configurations, the blocking resistor R$_1$ provides a charging/discharging path that is useful to reset the clamping voltage formed across capacitor C$_1$, when the diode D$_1$ is not in the forward bias mode. For example, at the beginning of a plasma process, the substrate is clamped to the electrostatic chuck surface 105A by charging the capacitor C$_1$ to a predetermined voltage. Such charging current supplied to the capacitor C$_1$ can be provided by the clamping network 116 through the resistor R$_1$ (FIGS. 2A and 2B). Similarly, the discharging current from capacitor C$_1$ in a dechucking step of the substrate can flow through R$_1$. The charging or discharging current of the capacitor C$_1$ determines the speed to reach a steady state of either clamping (e.g., chucking) or dechucking of the substrate. Therefore, in some embodiments, the blocking resistor R$_1$ is selected so that its resistance is not too large, such as less than about 50 MOhms.

Figure 5A:
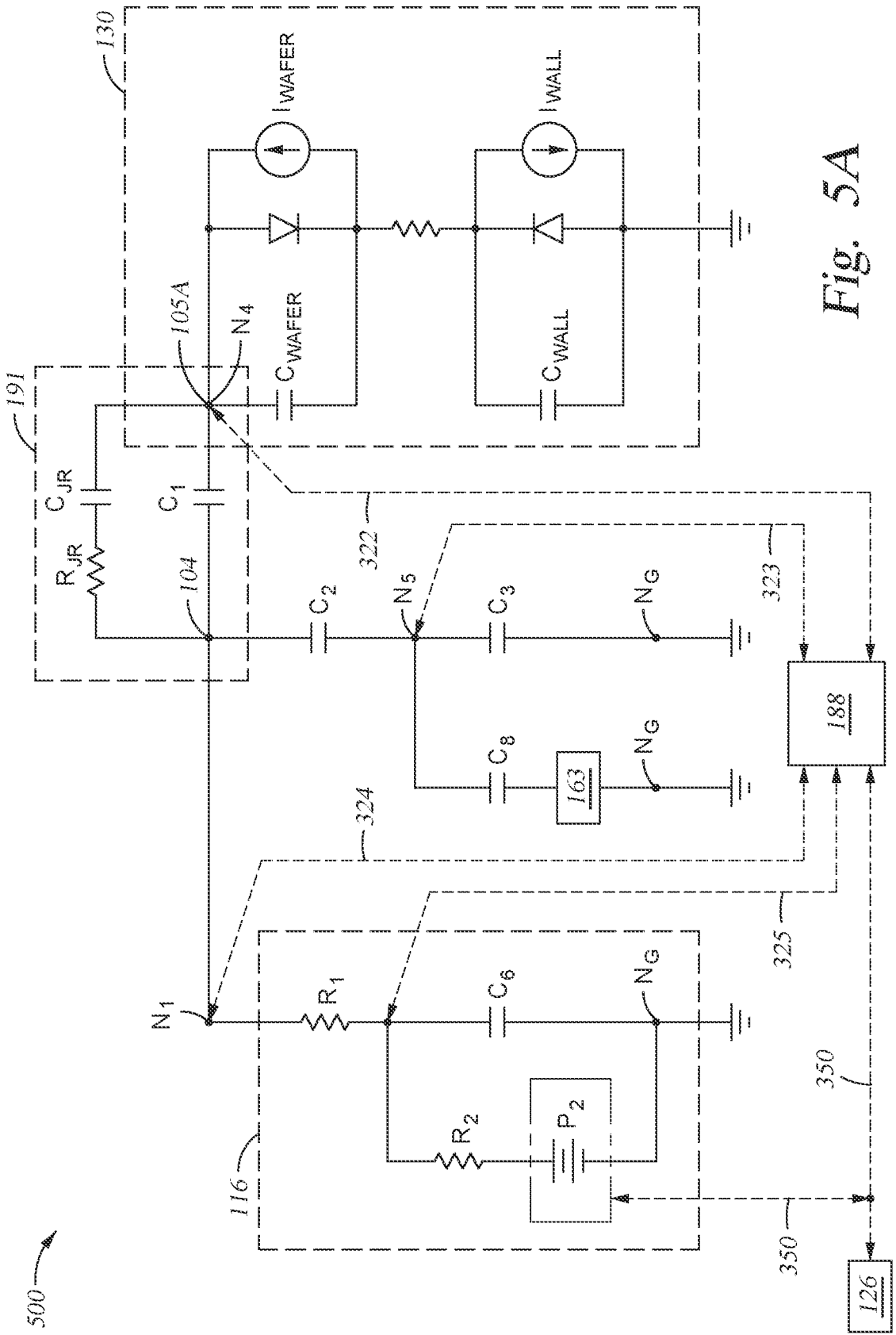
FIG. 5A is a functionally equivalent circuit diagram of a system that can be used to deliver an RF waveform to an electrode within the process chamber, according to one embodiment.
Figure 5B:
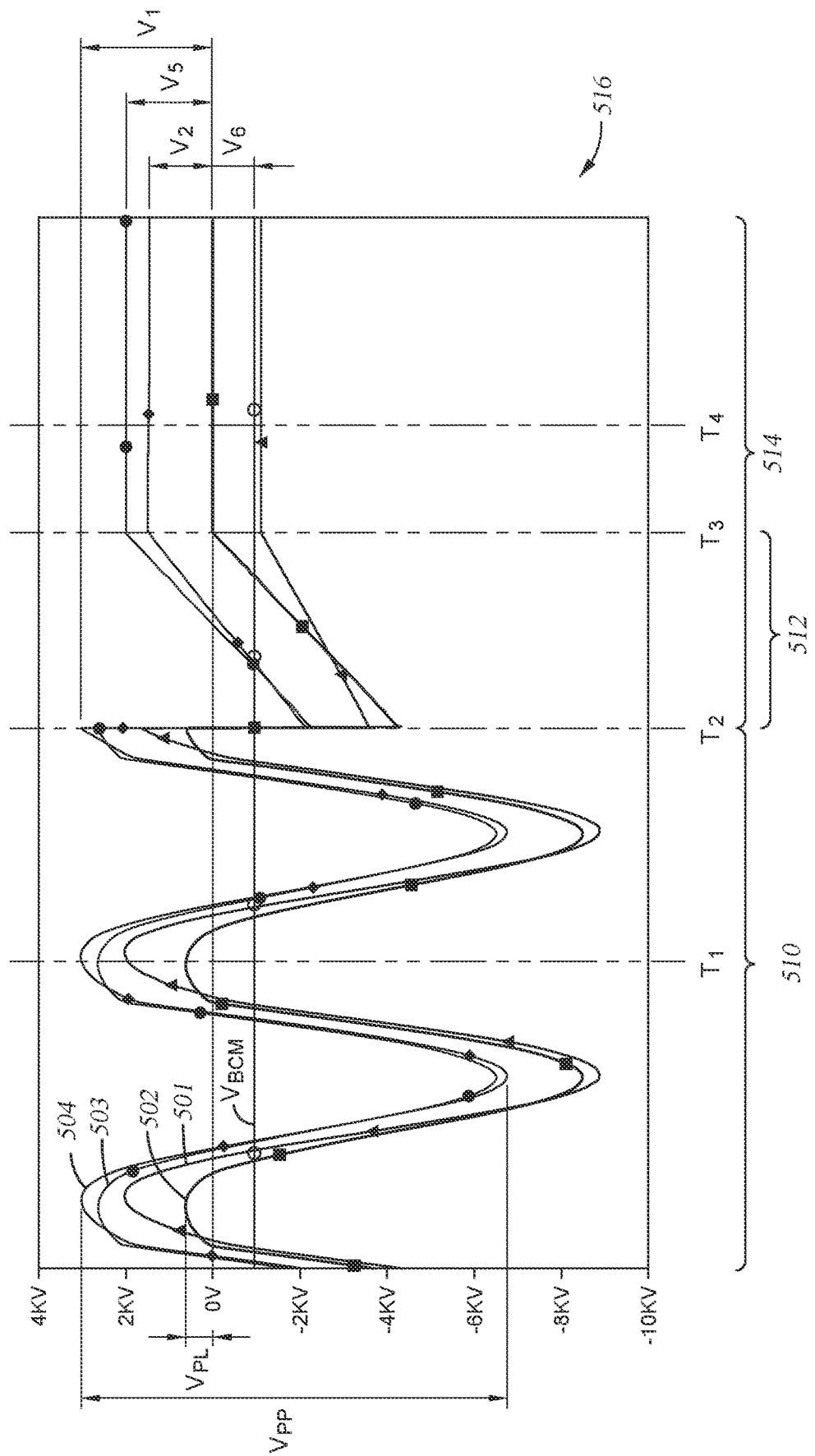
FIG. 5B illustrates an example of RF waveforms established at different portions of the functionally equivalent circuit diagram illustrated in FIG. 5A, according to one embodiment.

In one embodiment of the processing chamber 100, as illustrated in FIG. 5A, an RF waveform is provided to the support base 107, which is positioned at node N$_5$, by an RF source assembly 163. In some embodiments, the RF source assembly 163 can be a multi-frequency RF source. In this configuration, the RF source assembly 163 is coupled to an electrode, such as the support base 107, via an effective capacitance C$_8$ that is part of a RF match 162 and a first filter assembly 161, and the clamping network 116 is coupled to the biasing electrode 104 through the power delivery line 157. The RF waveform is provided to the load (e.g., the complex load 130) disposed within the processing chamber 100. The RF source assembly 163 in FIG. 5A, is capacitively coupled to the load 130 via the delivery of RF power to the support base 107. While not intending to be limiting as to the scope of the disclosure provided herein, and to simplify the discussion, one or more PV source assemblies, which are optional in this example, are not schematically shown in FIG. 5A. The overall control of the delivery of the RF waveform is controlled by use of signals provided from the controller 126. As illustrated in FIG. 5B, a sinusoidal RF waveform provided to the processing region 129 from the RF source assembly 163 is provided during a burst period 510, and is halted during a burst-off period 514. In FIG. 5A, the RF source assembly 163 has been reduced to a minimal combination of the components that are important for understanding of its role in establishing a desired RF waveform to the support base 107. As discussed above, the RF source assembly 163 can include components within an RF matching circuit 162 and a first filter assembly 161.

Process Monitoring and Control Examples

Figure 1E:
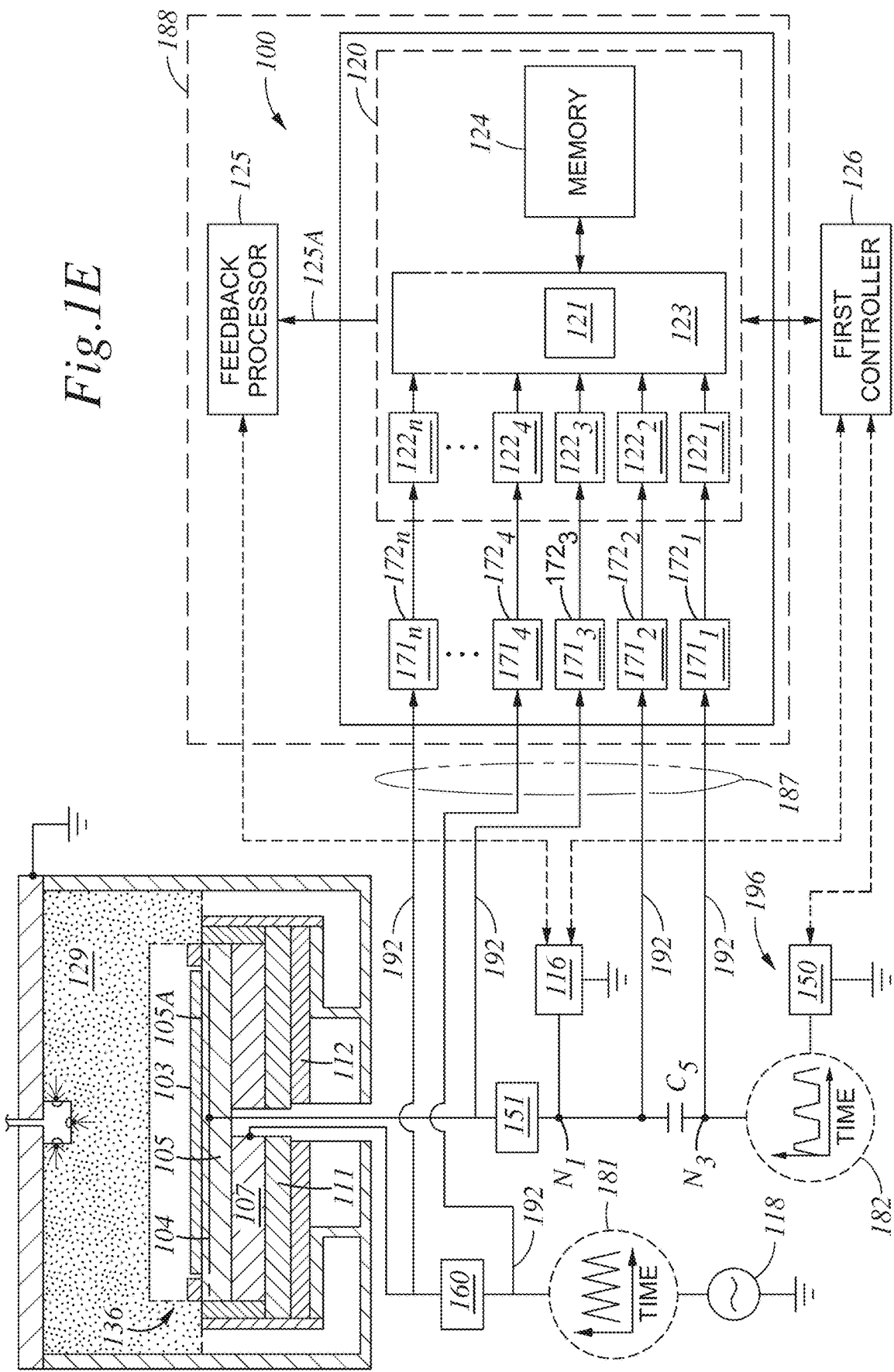
FIG. 1E is a schematic diagram illustrating an example of a processing chamber that includes a feedback loop that is illustrated in FIG. 1A, according to one embodiment.

In some embodiments, as illustrated in FIG. 1A, the processing chamber 100 further includes a signal detection module 188 that is electrically coupled to one or more electrical components found within a processing chamber 100 by use of a plurality of signal lines 187, which are illustrated in FIG. 1E. FIG. 1E illustrates a schematic view of the processing chamber 100 that includes multiple signal traces 192 that are coupled to various electrical components within the processing chamber 100, and are configured to deliver electrical signals to signal detection elements found within the signal detection module 188. In general, the signal detection module 188 includes one or more input channels 172 and a fast data acquisition module 120. The one or more input channels 172 are each configured to receive electrical signals from a signal trace 192, and are electrically coupled to the fast data acquisition module 120. The received electrical signals can include one or more characteristics of waveforms generated by the PV waveform generator 150 and/or the RF generator 118. In some embodiments, the fast data acquisition module 120 is configured to generate a control signal that is used to automatically control and maintain a substantially constant clamping voltage during processing, leading to improved clamping of the substrate during plasma processing. Further, the fast data acquisition module 120 includes one or more acquisition channels 122. The controller 126 is configured to generate a control signal that is used to automatically control and maintain the clamping voltage based on the signal information provided to the signal detection module 188 through the one or more signal lines 187, processed by components to the fast data acquisition module 120 and then received by the controller 126. The signal information received by the controller 126 can then be analyzed so that a desired real-time adjustment of the voltage applied by the DC voltage supply P$_2$ of the clamping network 116 can be provided based on the analyzed characteristics of the received signal information.

FIG. 1E schematically illustrates an example of the signal detection module 188 that includes multiple input channels 172 that are each electrically coupled to a corresponding acquisition channel 122 of the fast data acquisition module 120. The multiple input channels 172, such as input channels $172_1$-$172_3$ are coupled to connection points that are positioned in various parts of the first PV source assembly 196, to measure and collect electrical data from these connection points during processing. Additionally, multiple input channels 172, such as input channels $172_4$-$172_N$, are coupled to connection points that are positioned in various parts of the RF source assembly 163 (FIG. 1A), to measure and collect electrical data from one or more points or nodes within the RF source assembly 163 during processing. In one example, input channels $172_4$-$172_N$ are configured to detect an RF waveform 181 that is established at different points within the RF source assembly 163 during plasma processing. The multiple input channels 172 may also be coupled to various electrical sensing elements, such as a current sensor, which are configured to measure and collect electrical data at various points within the processing chamber 100. While FIG. 1E schematically illustrates a configuration in which only a few input channels 172 are coupled to points within the first PV source assembly 196 and RF source assembly 163, this configuration is not intended to be limiting as to the scope of the disclosure provided herein since the number of input channels 172 can be increased or decreased as required to control desired chamber processing applications. In some embodiments, one or more input channels 172 are connected to different portions of the first PV source assembly 196, second PV source assembly 197 and RF source assembly 163.

One or more of the input channels 172 can include a conditioning circuit 171, such as, for example, a conditioning circuit $171_1$ in input channel $172_1$ and a conditioning circuit $171_2$ in input channel $172_2$. Further, the one or more input channels 172 are configured to generate output waveforms that are conditioned. In some embodiments, the conditioning circuits 171 may each include a voltage divider, a low pass filters, both a voltage divider and a low pass filters, or even in some cases neither a voltage divider nor a low pass filter which is referred to herein as an unattenuated conditioning circuit. Examples of various conditioning circuit elements, such as voltage dividers and filters, and their integration with the input channels are further described in the U.S. Pat. No. 10,916,408, which is herein incorporated by reference in its entirety.

FIG. 1E illustrates a configuration in which the signal detection module 188 includes a plurality of input channels, such as the input channels $172_1$-$172_N$, where N is generally a number greater than one. Each of the input channels $172_1$-172N may be connected to different points within the plasma processing chamber 100. For example, the input channel $172_1$ may be connected to an electrical conductor that is used to couple the PV waveform generator 150 to a blocking capacitor $C_5$ (FIG. 1E). In embodiments where the input channel $172_1$ is coupled between the output of the PV waveform generator 150 and the blocking capacitor $C_5$, the input channel $172_1$ receives an input pulsed voltage waveform (e.g., first input pulsed voltage waveform 182 (FIG. 1E)) and the conditioning circuit $171_1$ generates an output waveform (e.g., a conditioned waveform). In one example, a received or measured input pulsed voltage waveform includes voltage pulses that include positive and negative voltage levels within different phases of each of the voltage pulses and high frequency oscillations within various phases of a pulse within the input pulsed voltage waveform, which when conditioned by the components, such as a voltage divider, within the conditioning circuit $171_1$ forms an output waveform that is at least provided at a lower voltage level due to the use of a voltage divider. In one example, an input pulsed voltage waveform, which includes voltage pulses that include positive and negative voltage levels within different phases of each of the voltage pulses and high frequency oscillations within at least one of the phases of each pulse within the input pulsed voltage waveform, is received by the input channel $172_1$ and is then conditioned by the components, such as a voltage divider and a low pass filter, within the conditioning circuit $171_1$ to form an output waveform that is a filtered waveform that is at a reduced voltage level. In embodiments where the input channel $172_2$ is coupled between the blocking capacitor $C_5$ and the biasing electrode 104, the input channel $172_2$ receives an input pulsed voltage waveform (e.g., second input pulsed voltage waveform) and the conditioning circuit $171_2$ generates an output waveform (e.g., a conditioned waveform). In general, the first input pulsed voltage waveform received the input channel $172_1$, will have different waveform characteristics from the second input pulsed voltage waveform received the input channel $172_2$, due to the position of their respective connection points along the power delivery line 157 within the plasma processing chamber 100.

The fast data acquisition module 120 is generally configured to receive analog voltage waveforms (e.g., conditioned waveforms) and transmit digitized voltage waveforms. The fast data acquisition module 120 includes one or more acquisition channels 122 that are each electrically coupled to a respective conditioning circuit 171 of a first input channel 172, and the fast data acquisition module 120 is configured to generate a digitized voltage waveform from a received conditioned voltage waveform (e.g., output waveform), wherein a data acquisition controller 123 of the fast data acquisition module 120 is configured to determine one or more waveform characteristics of the conditioned voltage waveform by analyzing the first digitized voltage waveform.

As illustrated in FIG. 1E, the fast data acquisition module 120 comprises a plurality of acquisition channels $122_1$-$122_N$, the data acquisition controller 123 and memory 124 (e.g., non-volatile memory). Each of the acquisition channels 122 is electrically coupled to the output of a corresponding one of the input channels 172 such that an acquisition channel 122 receives an output waveform from the corresponding one of the input channels 172. For example, the acquisition channel $122_1$ is electrically coupled to the output end of the input channel $172_1$ and receives either a first output waveform, depending on the position of the connection point of input end of the input channel $172_1$. Further, the acquisition channel $122_2$ is electrically coupled to the output end of the input channel $172_2$ and receives a second output waveform. Additionally, or alternatively, the acquisition channel $122_3$ is electrically coupled to the output end of the input channel $172_3$ and receives a third output waveform. The acquisition channel $122_N$ is electrically coupled to the output end of the input channel $172_N$ and receives the $N^{th}$ output waveform.

The data acquisition controller 123 is electrically coupled to an output of each of the acquisition channels 122 and is configured to receive the digitized voltage waveform from each of the acquisition channels 122. Further, the algorithms stored within the memory 124 of the data acquisition controller 123 are adapted to determine one or more waveform characteristics of each of the conditioned waveforms by analyzing each of the digitized voltage waveforms. The analysis may include a comparison of information received in the digitized voltage waveform with information relating to one or more stored waveform characteristics that is stored in memory 124 and is discussed further below.

The data acquisition controller 123 can include one or more of an analog-to-digital converter (ADC) (not shown), a processor 121 (FIG. 1E), communication interface (not shown), a clock (not shown) and an optional driver (not shown). The processor may be any general computing processor. Further, the processor may be a Field Programmable Gate Array (FPGA). The ADC converts the signal within the output waveforms from the analog domain to the digital domain and the output digital signal of the ADC is provided to the processor 121 for processing. The processor 121 of the data acquisition controller 123 determines the one or more waveform characteristics of the output waveform by analyzing the output digital signal provided from the ADC.

In various embodiments, the fast data acquisition module 120 additionally includes memory 124. The memory 124 may be any non-volatile memory. Further, the data acquisition controller 123 is electrically coupled with the memory 124 and is configured to cause waveform characteristics to be stored within the memory 124. In various embodiments, the memory 124 includes instructions executable by the data acquisition controller 123 to cause the data acquisition controller 123 to analyze the received output waveforms and/or transmit information corresponding to determined waveform characteristics based on the analysis of the received output waveforms. A waveform analyzer stored in memory 124 includes instructions executable by the data acquisition controller 123 and when executed cause the data acquisition controller 123 to analyze the output waveforms to determine the waveform characteristics. Information relating to the analyzed waveform characteristics can then be transmitted to one or more of a feedback processor 125 and/or the controller 126. The analysis performed by the data acquisition controller 123 can include a comparison of the waveform characteristics and one or more waveform characteristic threshold values stored in memory.

Figure 3A:
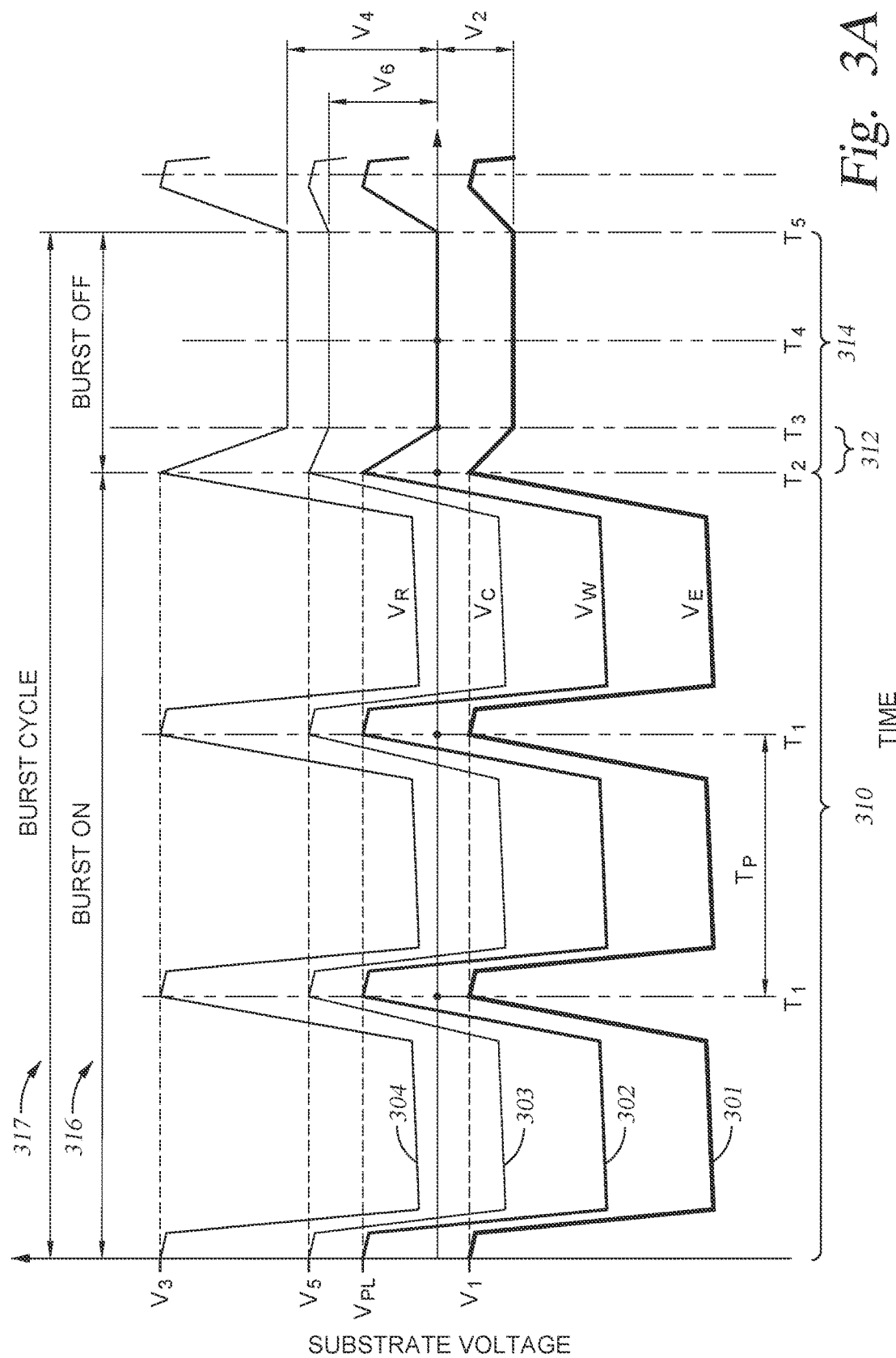
FIG. 3A illustrates an example of pulsed voltage (PV) waveforms established at different portions of the functionally equivalent circuit diagram illustrated in FIG. 3B, according to one embodiment.
Figure 3B:
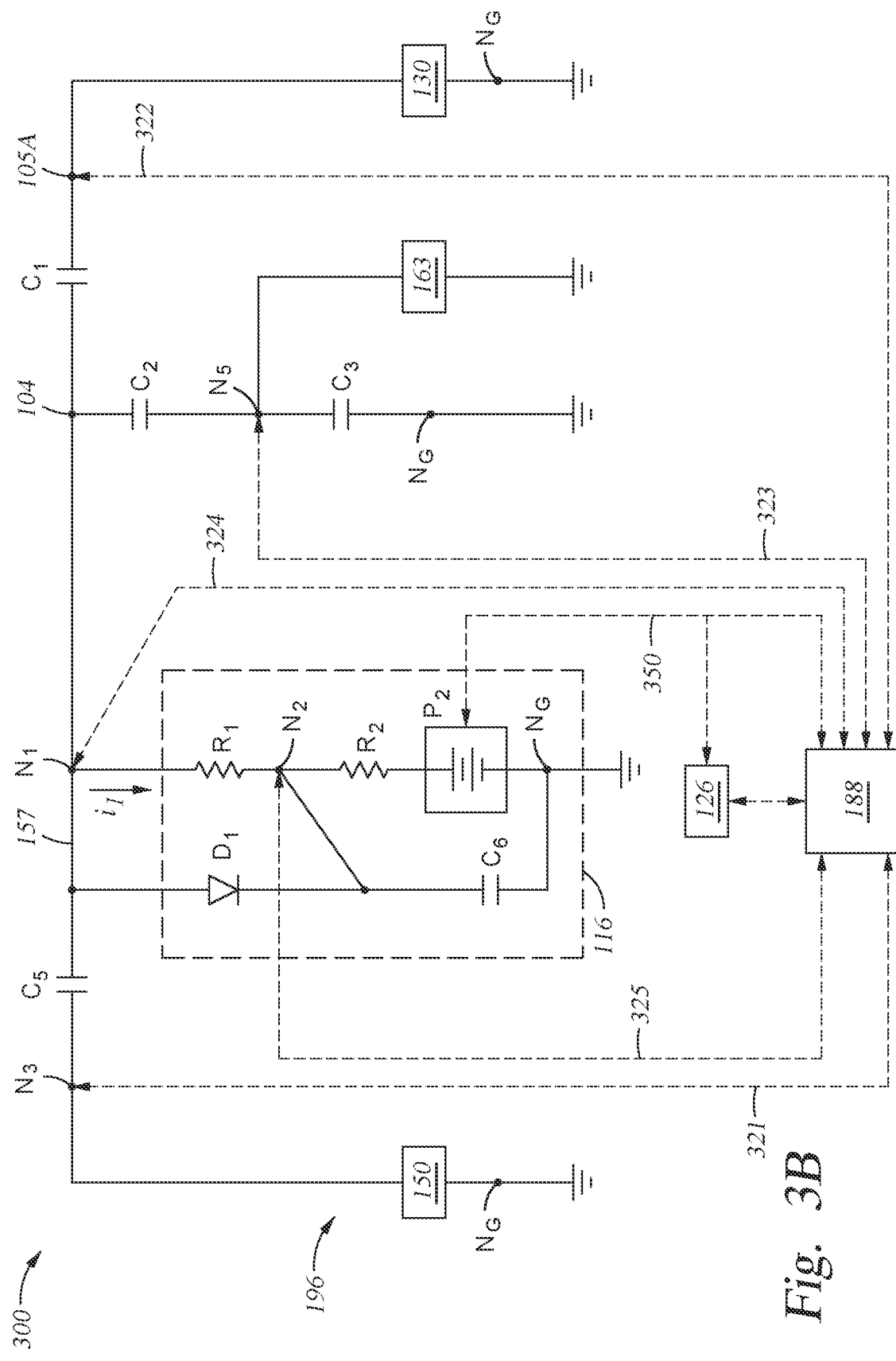
FIG. 3B is a circuit diagram illustrating a system that can be used to perform one or more methods described herein, according to one embodiment.

In some embodiments, the fast data acquisition module 120 is coupled to the feedback processor 125 via a data communication interface 125A, wherein the feedback processor 125 is configured to generate one or more control parameters using one or more waveform characteristics determined by one or more algorithms that are executed by the processor disposed within the data acquisition controller 123. In general, the feedback processor 125 may be any general computing processor. In some embodiments, the feedback processor 125 is generally one of: an external processor connected to the fast data acquisition module 120 via a data communication interface; an internal processor integrated within the fast data acquisition module 120; or is a portion of a substrate processing chamber controller (e.g., controller 126) connected to the fast data acquisition module via a data communication interface. The data acquisition module 120 may communicate information corresponding to one or more of the received output waveforms to the feedback processor 125. For example, the data acquisition module 120 may communicate information related to one or more detected and/or processed waveform characteristics of the one or more of the received output waveforms to the feedback processor 125. Further, the feedback processor 125 may be communicatively coupled with the plasma processing system 100 via a communication link 350 (FIG. 3B).

In various embodiments, the feedback processor 125 includes memory that further contains a software algorithm for instructing a processor within the feedback processor 125 to perform one or more portions of the methods described herein. The one or more algorithms include instructions, which when executed by the processor 121 in the fast data acquisition module cause the fast data acquisition module to process the one or more output waveforms (e.g., conditioned voltage waveforms) to determine one or more waveform characteristics of the received output waveforms. The controller 126, or feedback processor 125 disposed within the controller 126, includes memory that includes instructions, which when executed by a processor (CPU) causes the controller 126 or the feedback processor 125 to generate one or more control parameters using the determined one or more waveform characteristics provided from the fast data acquisition module 120. The instructions executed by the controller 126 or feedback processor 125 may also be further configured to cause the transmission of information, along the communication link 350 (FIG. 3B), that relates to the generated one or more control parameters to the clamping network 116. The clamping network 116 and/or controller 126 may also include memory that includes instructions, which when executed by a processor in the clamping network 116 and/or controller 126 causes the clamping network 116 to establish a desired chucking voltage level at the biasing electrode 104 based on the one or more control parameters generated by the feedback processor 125.

In one or more embodiments, the fast data acquisition module 120 may be electrically (wired or wirelessly) coupled with the controller 126 of the processing chamber 100. For example, the fast data acquisition module 120 transmits data to and/or receives data from the controller 126. For example, the fast data acquisition module 120 communicates information related to one or more waveform characteristics to the controller 126. Further, the processing chamber controller 126 may be communicatively coupled with the clamping network 116 of the processing chamber 100 via the communication link 350. In various embodiments, the processing chamber controller 126 is omitted. An algorithm stored within the memory of the processing chamber controller 126 can include instructions, which when executed by the controller CPU cause various process chamber set points to be adjusted, such as a chucking voltage set point on a chucking power supply, based on the information related to one or more waveform characteristics determined by the data acquisition controller 123.

Clamping Module Control Methods and Hardware Examples

As discussed above, the ability to provide real time control to the clamping voltage level applied to the clamping electrode (e.g., biasing electrode 104) during plasma processing is useful to improve and achieve repeatable plasma processing results and to assure that clamped substrates are not damaged during processing. FIG. 3A illustrates a burst 316 of pulsed voltage waveforms that includes a plurality of waveforms generated and delivered from one or more sources to one or more electrodes disposed in the process chamber 100. For example, waveforms 301-304 are each established at different points within the system 300 (FIG. 3B) by the delivery of a pulsed voltage waveform (not shown) that is generated by the PV waveform generator 150. In some embodiments, a series of individual bursts 316, which are each separated by a burst-off period 314, are provided to the biasing electrode 104. A burst cycle 317, which includes a burst 316 of pulsed voltage waveforms and a serially performed burst-off period 314, can be repeated multiple times during the processing of a substrate, as discussed further below in relation to FIGS. 3A and 4B-4D.

The system 300 is a simplified schematic which is generally represents a portion of the process chamber 100 that includes, for example, the PV waveform generator 150 of the first PV source assembly 196 (FIG. 1A) to the biasing electrode 104 disposed within the substrate support assembly 136. The components within system 300 are used to detect and determine waveform characteristics of one or more PV waveforms delivered from a PV waveform generator 150 by detecting the characteristics of electrical signals detected at different points within the system 300 at different times. Signal lines 321-325 are similar to the plurality of signal lines 187 illustrated in FIG. 1E, and thus are intended to illustrate the connections between various points within the processing system and the input channels 172 (not shown in FIG. 3B) of the signal detection module 188.

As illustrated in FIG. 3A, a plurality of measured PV waveforms 301-304 include a series of pulses that are provided during a PV waveform burst 316. In this example, the last three of a series of pulses are shown within the burst 316. Each of the three pulses within each of the PV waveforms 301-304 have a waveform period $T_p$. After the delivery of a burst 316 of pulses, which has a burst-on period 310, the output of the PV waveform generator 150 is stopped so that the system 300 experiences a period of time when no PV waveforms are being generated by the PV waveform generator 150. The time when no PV waveforms are being formed is referred to herein as a non-burst period 314, or "burst off" period 314. Between the burst 316 and a steady state portion of the non-burst period 314 is a transition region, which is referred to herein as a plasma relaxation period 312. At the end of the non-burst period 314, a second burst (not shown) that includes a plurality of pulses is generated and delivered from the PV waveform generator 150. During processing of a substrate it is typical for each burst 316, within a series of bursts, to be separated by the burst-off periods 314, such that a burst 316 and a burst-off period 314 (i.e., burst cycles 317) are serially formed multiple times. Thus, a single burst cycle 317, which includes a burst 316 and a burst-off period 314, has a length that is equal to the sum of a burst-on period 310 (i.e., $T_{ON}$) plus the burst-off period 314 (i.e., $T_{OFF}$), which is also referred to herein as the burst period $T_{BD}$ (FIG. 4B). In one example, the burst-on period 310 is between about 100 microseconds (μs) and about 10 milliseconds (ms), such as between about 200 μs and about 5 ms. In one example, the waveform period $T_p$ is between about 1 μs and about 10 μs, such as about 2.5 μs. The burst duty cycle can be between about 5%-100%, such as between about 50% and about 95%, wherein the duty cycle is the ratio of the burst-on period 310 divided by the burst-on period 310 plus the non-burst period 314.

The PV waveform 301 is measured at a point between the blocking capacitor $C_5$ and the biasing electrode 104, such as illustrated in FIG. 3B as node $N_1$. The measured voltage is thus related to actual voltage measured at the biasing electrode 104 during the different phases of a processing sequence performed in a processing chamber. The measured voltage of this PV waveform, which is also referred to herein as being electrode voltage $V_E$, varies over time as a series of bursts 316 and non-burst periods 314 are provided from a PV waveform generator 150 to the biasing electrode 104 during processing. In one embodiment, the PV waveform 301 is measured by an electrical coupling assembly (not shown) that is positioned at node $N_1$. The electrical coupling assembly is coupled to signal trace 324 that is in communication with an input channel 172 within the signal detection module 188.

In some embodiments, a PV waveform (not shown) generated at the output of the PV waveform generator 150 is measured and utilized in one or more of the processes described herein by measuring the voltage formed at an electrical coupling assembly (not shown) that is positioned at node $N_3$. The PV waveform measured at the PV waveform generator 150 will closely track the PV waveform 301, and will have a measured voltage that is offset from the PV waveform 301 by an amount that is at least related to the set point of DC voltage supply $P_2$. In this configuration, as shown in FIG. 3B, the electrical coupling assembly is coupled to signal trace 321 that is in communication with an input channel 172 within the signal detection module 188.

The PV waveform 302 is intended to represent the voltage established on a substrate 103 during processing due to the delivery of the PV waveforms provided from the PV waveform generator 150. As shown in FIG. 3A, the PV waveform 302 tracks the measured PV waveform 301 very closely, such that the PV waveform 302 is typically considered to be offset a fixed amount from the PV waveform 301. The offset voltage formed during processing between the electrode 104 and substrate 103 is referred to herein as clamping voltage, and is primarily set by the set point of DC voltage supply $P_2$. In some configurations, PV waveform 302 can be measured by a voltage probe in good contact with the frontside or backside of the substrate 103 and attached to signal trace 322 that is in communication with an input channel 172 within the signal detection module 188. In most process chamber hardware configurations the substrate voltage is not easy to directly measure due to ESC hardware limitations, measurement signal integrity issues and capacitive coupling between chamber component related issues. By use of the methods described herein the need for the direct measurement of the substrate voltage can be avoided by use of the various measurement techniques and processes described herein.

In some embodiment, the PV waveform 303 is measured at a node directly coupled to a second conductor plate positioned within the processing chamber 100. In one embodiment, the second conductor plate is the support base 107, which is positioned at node $N_5$ in FIG. 3B. As shown in FIG. 3B, the second conductor plate is positioned between the capacitance $C_3$ and the capacitance $C_2$, which are intended to represent the capacitances formed by the presence of the insulator plate 111 and the dielectric layer 105C, respectively. The measured voltage is thus related to actual voltage measured at the support base 107 during the different phases of a processing sequence performed in a processing chamber. The measured voltage of the PV waveform, which is referred to herein as being voltage $V_C$, varies over time as a series of bursts 316 and non-burst periods 314 are provided from a PV waveform generator 150 to the biasing electrode 104 during the processing. In some embodiments, the PV waveform 303 is formed by use of a source, such as the RF source assembly 163 which is coupled to the chamber through the conductor plate 107. The PV waveform 303 can be measured by use of an electrical coupling assembly, which is positioned at node $N_5$, and is coupled to signal trace 323 that is in communication with an input channel 172 within the signal detection module 188.

In some embodiments, the PV waveform 304 is measured at a node directly coupled to a PV source 150. The measured voltage of the PV waveform 304, which is referred to herein as being voltage VR, varies over time as a series of bursts 316 and non-burst periods 314 are provided from a PV waveform generator 150. In some embodiments, the PV waveform 304 is configured to achieve a desired voltage V4 during the non-burst periods 314, and thus does not electrically float during the non-burst periods 314. In some embodiments, the PV waveform 304 is configured to electrically float during the non-burst periods 314. The PV waveform 304 can be measured by use of an electrical coupling assembly that is coupled to the signal trace 321 that is coupled to node $N_3$ and is in communication with an input channel 172 within the signal detection module 188.

Figure 4A:
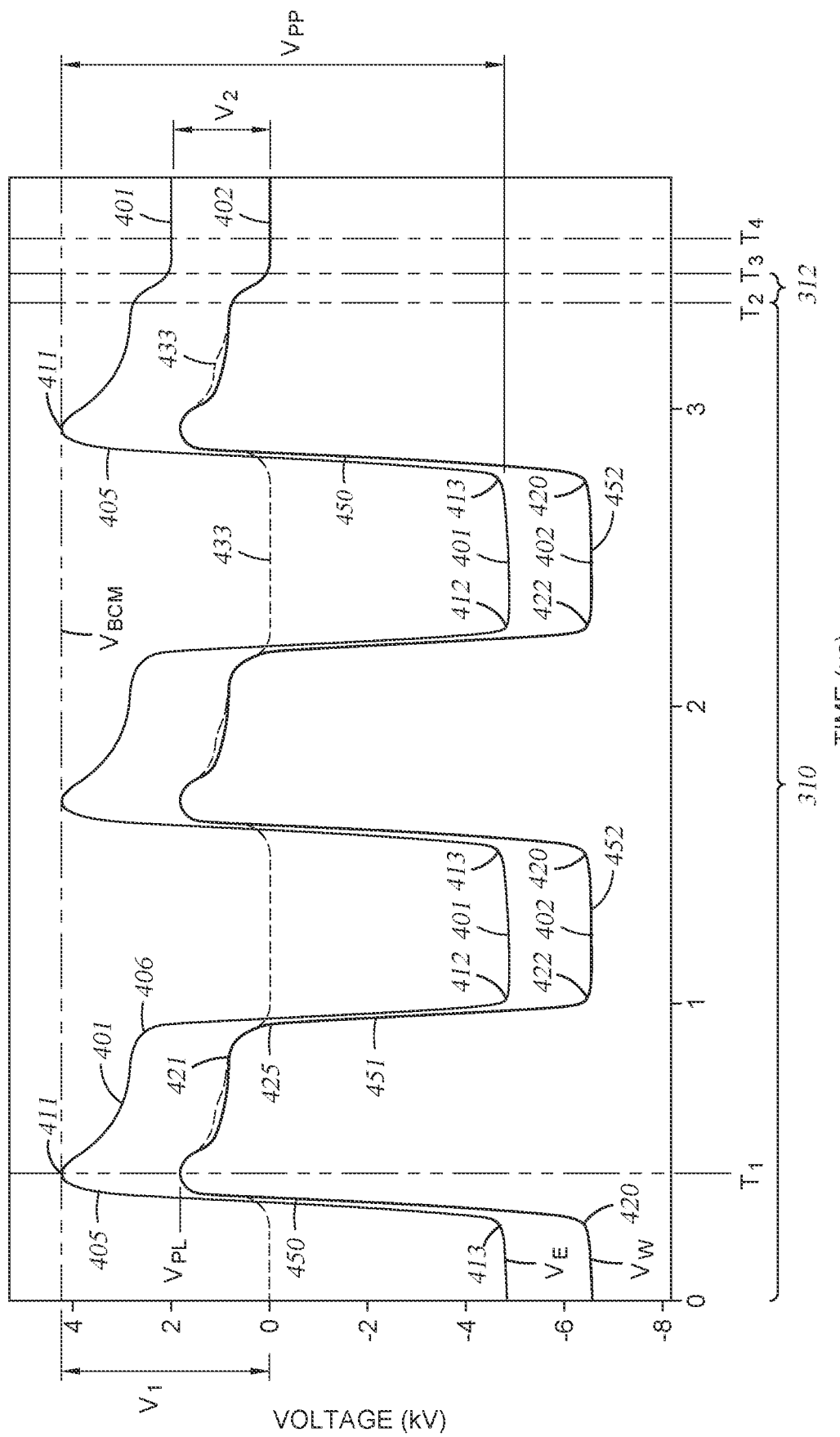
FIG. 4A illustrates an example of negative pulsed voltage (PV) waveforms established at the biasing electrode and substrate, according to one embodiment.
Figure 4B:
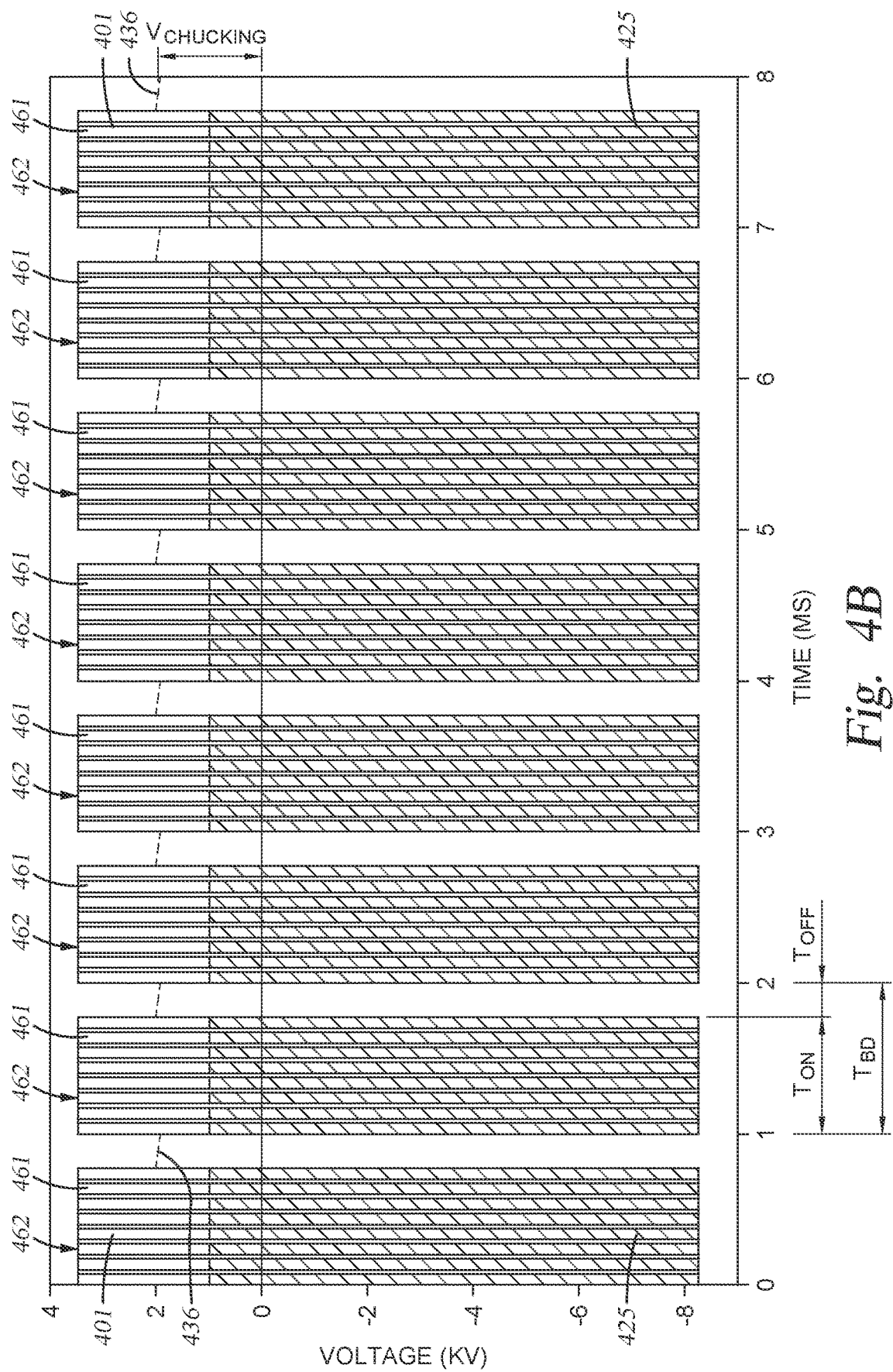

FIG. 4A illustrates an example of a PV waveform 401 to the biasing electrode 104 by use of a PV waveform generator 150 within a PV source assembly during a portion of the waveform period $T_p$ and a DC voltage source $P_2$ in the assembly 116. The PV waveform 402, as shown in FIG. 4A, includes a series of PV waveforms established at the substrate (e.g., $V_W$) due to the PV waveform 401 being established at the biasing electrode 104 by a PV waveform generator 150 and a DC voltage source $P_2$. The PV waveforms 401 and 402 are intended to illustrate more detailed examples of portions of the PV waveforms 301 and 302 that are illustrated in FIG. 3A.

The output of the PV waveform generator 150, which can be controlled by a setting in a plasma processing recipe stored in the memory of the controller 126, forms the PV waveform 401 that includes a peak-to-peak voltage, which is also referred to herein as the pulse voltage level $V_{pp}$. The PV waveform 402, which is the waveform seen by the substrate 103 due to the delivery of the PV waveform 401, is characterized as including a sheath collapse and recharging phase 450 (or for simplicity of discussion the sheath collapse phase 450) that extends between point 420 and point 421, a sheath formation phase 451 that extends between point 421 and point 422, and an ion current phase 452 that extends between point 422 and back to the start at point 420 of the next sequentially established pulse voltage waveform; Depending on the desired plasma processing conditions, it is desirable to control and set at least the PV waveform characteristics, such as PV waveform frequency $(1/T_P)$, pulse voltage level $V_{pp}$, pulse voltage on-time, and/or other parameters of the PV waveforms within a burst 316 to achieve desirable plasma processing results on a substrate. In one example, pulse voltage (PV) on-time, which is defined as the ratio of the ion current time period (e.g., time between point 422 and the subsequent point 420 in FIG. 4A) to the waveform period $T_p$, is varied from one plasma processing recipe to another to adjust the etch rate. In some embodiments, the PV on-time is greater than 50%, or greater than 70%, such as between 80% and 95%.

FIG. 4B illustrates PV waveforms in which a series of bursts 462 of pulsed voltage waveforms are established at the biasing electrode 104 and the substrate surface. In the example illustrated in FIG. 4B, a plurality of pulses 461 within each burst 462 include a series of PV waveforms 401 that are established at the biasing electrode 104. In this example, each of the bursts 462 includes pulses 461 that have a PV waveform that has a consistent pulsed voltage shape (e.g., constant voltage magnitude is provided during a portion of each PV waveform 401), a burst delivery length $T_{ON}$ that does not vary from one burst 462 to another over time and a burst rest length $T_{OFF}$ that does not have a varying length over time. The burst rest length $T_{OFF}$ is formed by halting the delivery of the PV waveforms provided during the burst delivery length $T_{ON}$ time for a period of time. The duty cycle of the bursts 462, which is the ratio of the length of time the plurality of pulses are delivered during the burst (i.e., burst delivery length $T_{ON}$) divided by the duration of a burst period (i.e., $T_{BD}=T_{ON}+T_{OFF}$), is also constant in this example. For clarity of discussion, the total of the burst on period 310 and the burst off period 314, referenced in FIG. 3A, is intended to be equivalent to the burst period $T_{BD}$ referenced in FIG. 4B. One will appreciate that in other processing methods, the plurality of pulses 461 could include negative pulse waveforms, shaped pulse waveforms or positive pulse waveforms, or combinations thereof. As illustrated in FIG. 4B, during the burst rest length $T_{OFF}$ the biasing electrode potential curve 436 is primarily controlled by the chucking voltage that is applied and controlled by the bias compensation module 116, and thus may be at a different voltage level than the plasma potential.

FIG. 4C illustrates a PV waveform in which a multilevel series of bursts 490 of pulsed voltage waveforms are established at an electrode, such as the biasing electrode 104. During processing the series of bursts 490, which include a plurality of bursts 491 and 492 and a burst off period 493, are provided to the biasing electrode 104. The series of bursts 490, which include a series of bursts 491 and 492 that are followed by a burst off period 493, can be sequentially repeated one or more times. In one example, each of the plurality of bursts 491 and 492 include a plurality of PV waveforms 401 that are supplied at different voltage levels as illustrated by the difference in the levels of each of the peaks of the each of the bursts 491 and 492. In some embodiments, the transition from burst 492 to a burst 491 is separated by the burst off period 493, while the transition from burst 491 to burst 492 is not separated by the burst off period 493. The series of bursts 490 are often referred to as being a "high-low" series of bursts due to the pulse waveforms provided to the biasing electrode 104 during the burst 491 having a higher pulse voltage level $V_{pp}$ (FIG. 4A) than the pulse waveforms provided to the biasing electrode 104 during the burst 492. The bursts 491 often referred to herein as including a "high" pulse voltage level $V_{pp}$ and busts 492 often referred to herein as including a "low" pulse voltage level $V_{pp}$.

Figure 4D:
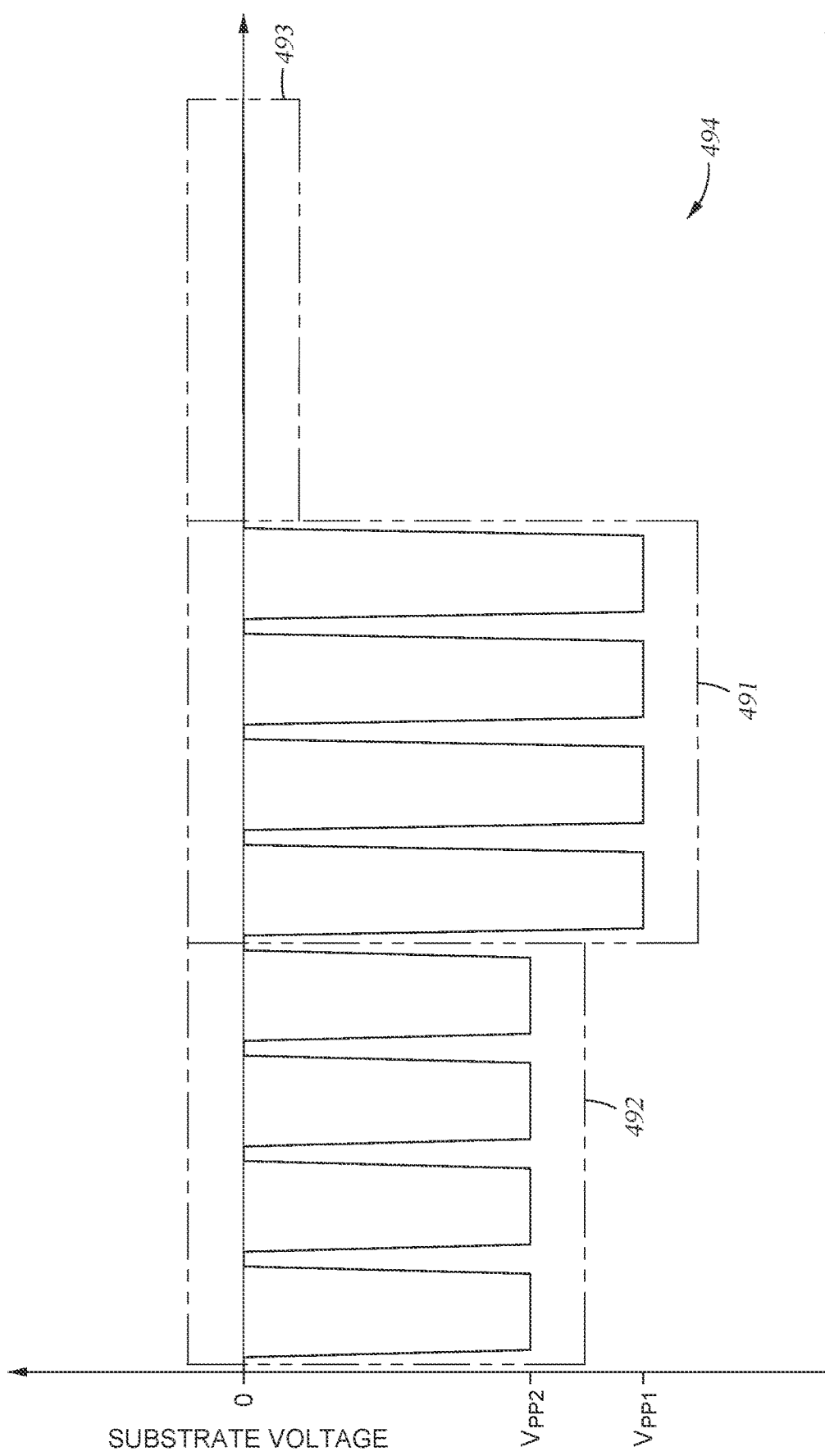

FIG. 4D illustrates a PV waveform in which a multilevel series of bursts 494 of pulsed voltage waveforms are established at an electrode, such as the biasing electrode 104. The series of bursts 494, which also includes the plurality of bursts 491 and 492 and the burst off period 493 that are oriented in a different "low-high" configuration, can be sequentially repeated one or more times. In one example, each of the plurality of bursts 491 and 492 include a plurality of PV waveforms 401 that are supplied at different voltage levels as illustrated by the difference in the levels of each of the peaks of the each of the bursts 491 and 492. In some embodiments, the transition from burst 492 to a burst 491 is not separated by the burst off period 493, while the transition from burst 491 to the next burst 492 is separated by the burst off period 493.

FIG. 5B illustrates a burst 516 of RF waveforms that includes a plurality of waveforms generated and delivered from an RF source assembly 163 to an electrode disposed in the process chamber 100. For example, waveforms 502-504 are each established at different points within the system 500 (FIG. 5A) by the delivery of an RF waveform 501 that is generated by the RF generator 118. Waveforms 502-504 include the waveform $V_W$ formed at the substrate, waveform $V_S$ formed at the surface of the electrostatic chuck, and the waveform $V_E$ formed at the biasing electrode 104, respectively. FIG. 5A illustrates an example of a configuration of a system 500 that is used to detect and determine waveform characteristics of one or more RF waveforms delivered from a RF generator 118 by detecting the characteristics of electrical signals detected at different points within the system 500 at different times. The signal traces 322-325 are similar to the plurality of signal traces 192 of the plurality of signal lines 187 illustrated in FIG. 1E, and thus are intended to illustrate the connections between various points within the processing system and the input channels 172 (not shown in FIG. 3B) of the signal detection module 188.

As illustrated in FIG. 5B, a plurality of measured RF waveforms 501-504 include a series of pulses that are provided during an RF burst 516. In this example, two cycles of the RF waveform are shown within the burst 516. The measured RF waveforms, such as RF waveforms 501-504, have a waveform frequency that is controlled by the RF generator 118, which can be between 100 kHz and 120 MHz. After the delivery of the RF burst 516, which has a burst period 510, the output of the RF generator 118 is stopped so that the system 500 experiences a period of time when no RF waveforms are being generated by the RF generator 118. The time when no RF waveforms are being formed is referred to herein as a non-burst period 514, or "burst off" period 514. Between the burst 516 and a steady state portion of the non-burst period 514 is a transition region, which is referred to herein as a plasma relaxation period 512. At the end of the non-burst period 514, a second burst (not shown) that includes a plurality of RF waveforms is generated and delivered from the RF generator 118. During processing of a substrate it is typical for each burst 516, within a series of bursts, to be separated by the non-burst periods 514, such that the series of bursts 516 and non-burst periods 514 are serially formed multiple times. In one example, the burst period 510 is between about 20 microseconds (μs) and about 100 milliseconds (ms), such as between about 200 μs and about 5 ms. The burst duty cycle can be between about 5%-100%, such as between about 50% and about 95%, wherein the duty cycle is the ratio of the burst period 510 divided by the burst period 510 plus the non-burst period 514.

Plasma Potential Analysis

Figure 6A:
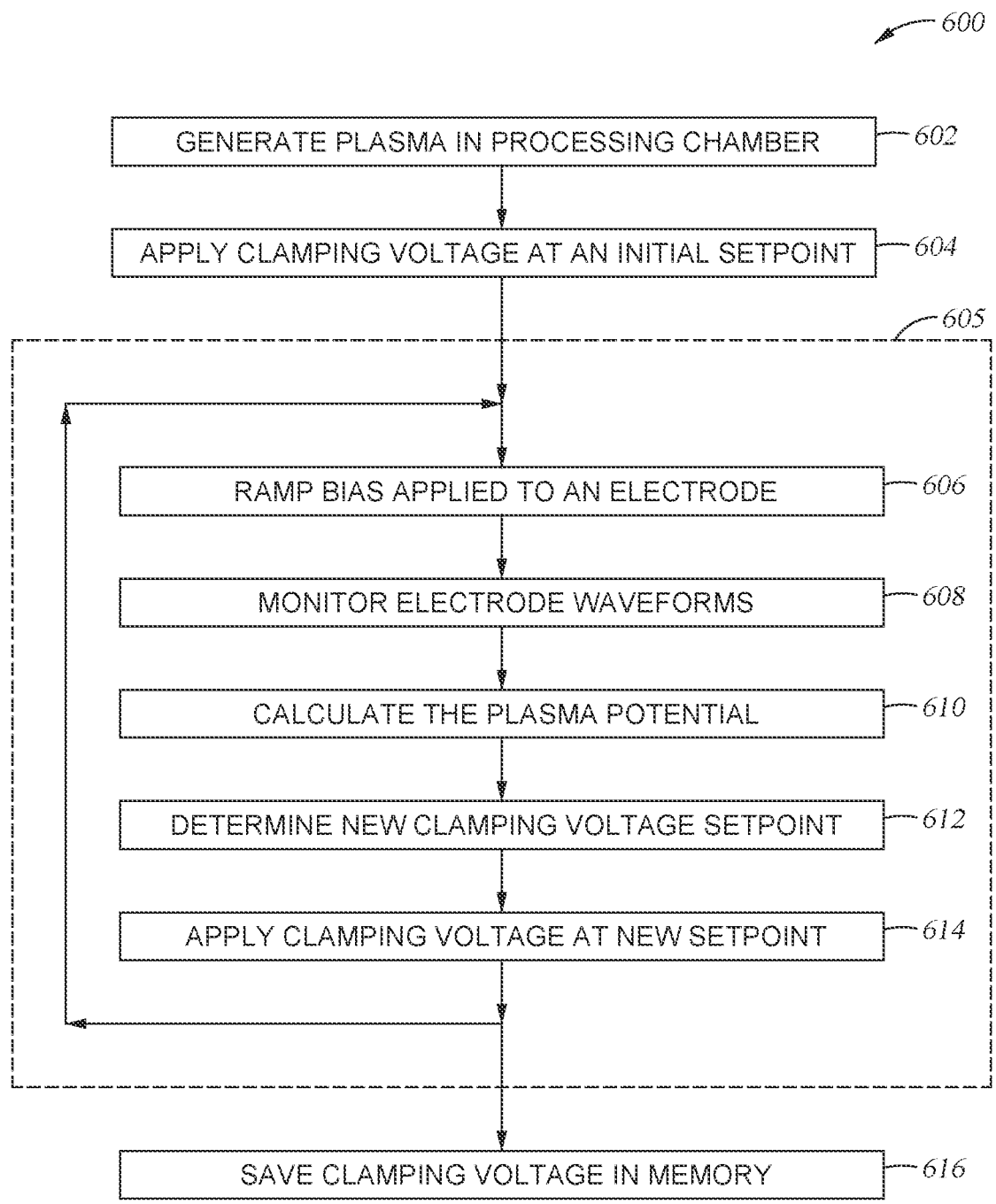
FIGS. 6A-6B are process flow diagrams illustrating methods of biasing and clamping a substrate during plasma processing, according to one or more embodiments.

To reliably generate a desired clamping voltage $V_{DCV}$ during a plasma process, the variations in the plasma potential need to be accounted for when delivering a clamping voltage to a clamping electrode during processing. As discussed above, the ability to reliably measure and monitor the plasma potential in a processing chamber that is configured to serially process multiple substrates in a production environment is a non-trivial task. In one or more of the embodiments of the disclosure provided herein, the plasma potential is determined based on measurements made at different points within the plasma processing system during different portions of a substrate processing sequence. FIG. 6A illustrates a processing method that can be used to measure, monitor and control attributes of a plasma formed in a processing chamber so that the desirable clamping voltage can be reliably controlled and applied to a clamping electrode disposed within a substrate support. It is assumed that the capacitance $C_1$ is a net series capacitance of the dielectric layer 105B, and the gap between dielectric surface 105A and substrate backside, and a possible thin dielectric layer on substrate backside surface.

A plasma potential curve 433, which is shown in FIG. 4A, illustrates the local plasma potential during the delivery of the PV waveform 401 that is established at the biasing electrode 104 by use of a PV waveform generator 150. During processing the plasma potential generally remains at or close to zero volts throughout most of the burst-on period 310 and during the burst-off period 314. The plasma potential will achieve its peak value ($V_{PL}$) during the sheath collapse phase 450, which coincides with time $T_1$ in FIGS. 3A and 4A. Additionally, at time $T_1$, when the multiphase PV waveform 401 has reached its peak value, the voltage at the biased electrode (e.g., biasing electrode 104) will be equal to the output voltage ($V_{BCM}$) supplied by the DC voltage source $P_2$. Therefore, the fluctuation in the plasma potential can be on the order of 1 kV or larger and thus substrate clamping systems that do not take into account the fluctuations in the plasma potential due to the delivery of a bias to one or more electrodes within the processing chamber 100 can lead to poor plasma processing results and/or damage to the substrate. Referring to FIG. 4A, the times $T_2$ and $T_3$ illustrate the start of the burst-off period and the end of the transition period 312, respectively. The period of time between times $T_2$ and $T_3$ is referred to herein as the plasma relaxation time, which is generally the time it takes the plasma to extinguish once the PV waveforms and RF power delivery has been halted during the burst-off period 314. The time $T_4$ is intended to represent a measurement time that is positioned after the transition period 312 has ended and before the next burst 316 (not shown) has started.

In an effort to provide the desired clamping voltage ($V_{DCV}$) at node $N_1$, the set point of the DC voltage source $P_2$, $V_{BCM}$ at node $N_2$, is adjusted by use of computer implemented instructions that are configured to determine and thus account for the variation in the plasma potential. The desired clamping voltage ($V_{DCV}$) set point is generally equal to the peak plasma potential ($V_{PL}$), which is affected by the plasma processing conditions and the substrate surface material, plus the clamp voltage set point ($V_{Clamp}$) for the type of electrostatic chuck that is being used during processing. The desired clamping voltage set point ($V_{DCV}$) can thus be written as shown in equation (1).

$$V_{DCV} = V_{PL} V_{Clamp} \tag{1}$$

The clamp voltage set point ($V_{Clamp}$) is a constant voltage value that has been determined through prior testing and evaluation of the electrostatic chucking characteristics of the actual electrostatic chuck or type of electrostatic chuck (e.g., columbic electrostatic chuck). The prior testing and evaluation results are used to determine a minimum substrate clamping force voltage to assure that the substrate will have a good thermal contact to the dielectric surface 105A and negligible helium will leak through the outer sealing band of the substrate support 105 when the substrate is clamped to the surface of the substrate support 105 during plasma processing. The clamp voltage set point ($V_{Clamp}$) value will vary due to the type of electrostatic chuck that is being used (e.g., columbic or Johnsen-Rahbek electrostatic chuck), backside gas pressure being used during processing, and temperature of the dielectric 105A during plasma processing.

In some embodiments of the clamping network 116, a diode $D_1$ electrically connects nodes $N_1$ and $N_2$ (See FIGS. 2A and 3B), and is configured to only allow current to flow in a direction from node $N_1$ to $N_2$ (i.e., anode side of the diode $D_1$ is coupled to node $N_1$ and cathode side of diode $D_1$ is coupled to node $N_2$). Due to the configuration of the diode $D_1$, the voltage at node $N_1$ is restricted to a value that is no higher than the voltage at node $N_2$ ($V_{BCM}$) at all times. Thus, during each pulse period $T_p$ (FIG. 3A) of a PV waveform, the peak voltage at node $N_1$ is reset to the voltage of node $N_2$ ($V_{BCM}$), which is the output voltage of the DC voltage source $P_2$ at steady state when a large capacitance $C_6$ (e.g., between 0.5 and 10 μF) is used. The peak voltage at node $N_1$ is the sum of peak plasma potential $V_{PL}$ and the actual clamp voltage across capacitor $C_1$. To achieve the clamp voltage set point, the set point of DC voltage source $P_2$ ($V_{BCM}$)

should be equal to the desired clamping voltage set point ($V_{DCV}$), as shown in below in a rewritten version of equation (1).

$$V_{BCM} = V_{DCV} = V_{PL} - V_{Clamp}$$

However, in some embodiments of the clamping network 116, no diode $D_1$ is used to connect nodes $N_1$ and $N_2$ (see FIGS. 2B and 5A). In this configuration, the voltage of node $N_2$ ($V_{BCM}$) will still be equal to the voltage of the DC voltage source $P_2$ at steady state given large $C_6$ (e.g. between 0.5 and 10 µF). In some embodiments, the resistor $R_1$ and capacitor $C_6$ values in the clamping network 116 are selected so that the time constant of $R_1 * C_6$ is much larger than the burst period $T_{BD}$ (FIG. 4B), so that the voltage at node $N_2$ is substantially constant within one burst period $T_{BD}$. Since nodes $N_1$ and $N_2$ are connected through a high resistance value resistor, resistor $R_1$, the time-averaged (in a burst period $T_{BD}$) voltage at node $N_1$ will equal the time-averaged (in a burst period $T_{BD}$) voltage at node $N_2$, which is equal to the clamping voltage $V_{BCM}$. To achieve the clamp voltage set point $V_{Clamp}$ across capacitor $C_1$, the time-averaged (in a burst period $T_{BD}$) voltage at node $N_1$ should be the time-averaged substrate (in a burst period $T_{BD}$) voltage plus the clamp voltage set point $V_{Clamp}$. As is discussed further below, the time-averaged substrate voltage can be approximated by use of the PV waveform generated by the PV waveform generator 150 and the peak plasma potential $V_{PL}$. Thus, the set point of DC voltage source $P_2$ (DC voltage source output voltage $V_{BCM}$) can be determined by the pulser voltage waveform, the peak plasma potential $V_{PL}$, and the clamp voltage set point $V_{Clamp}$.

As illustrated in FIG. 4A, the plasma potential $V_{Plasma}$ (i.e., curve 433) is equal to or near zero for most of the time during processing and reaches a peak level at time $T_1$. Therefore, to determine the peak plasma potential ($V_{PL}$) at the surface of the substrate, which is formed at time $T_1$, measurements that account for all of the various factors that will affect the plasma potential are measured and used to adjust the output voltage ($V_{BCM}$) of the DC voltage source $P_2$ to achieve the desired clamping voltage ($V_{DCV}$). To determine the peak plasma potential ($V_{PL}$) it is first assumed that, and the system is configured such that, charge conservation is maintained in one or more nodes within an electrode biasing circuit at a time scale of a burst period $T_{BD}$. In some embodiments, as shown in FIGS. 2A-2B, 3B and 5A, charge conservation is maintained at node $N_1$ of the electrode biasing circuit. In one embodiment, capacitors $C_1$, $C_2$, and $C_5$ are directly coupled to the node $N_1$, and it is assumed that the inductor Li (e.g., line inductance illustrated in FIGS. 2A-2B) is small enough to induce negligible voltage oscillation compared to the PV voltages generated by the PV waveform generator 150. As illustrated in FIGS. 2A-2B, 3B and 5A, node $N_1$ is also coupled to the resistor $R_1$ and then to the capacitor $C_6$. Thus, the total charge ($Q_T$) flowing through resistor $R_1$ at the time scale of a burst period $T_{BD}$ is on the order of $Q_T \approx T_{BD} * V_{BCM}/R_1$. In some embodiments, the resistance of the resistor $R_1$ is selected such that it is large enough, so that the charge flowing through resistor at the time scale of a burst period $T_{BD}$, is negligible compared to the charges stored in capacitors $C_1$, $C_2$, and $C_5$, for example. Therefore, in this configuration, the presence of a large blocking resistor $R_1$ will cause the capacitor $C_6$ to functionally appear to not be directly coupled to node $N_1$, and the electrostatic charge associated to node $N_1$ will be the sum of electrostatic charge stored in the capacitors $C_1$, $C_2$, and $C_5$, which are directly coupled to the node $N_1$.

Equation (2) below is used to describe charge conservation at a node in the electrode biasing circuit, meaning the sum of electrostatic charge $Q_{Burst}$ measured during a portion of the burst-on period 310 is equal to the amount of stored charge $Q_{Off}$ measured during the burst-off period 314 right after burst-on period 310.

$$\Sigma Q_{Burst} = \Sigma Q_{Off} \qquad (2)$$

FIGS. 2A-2B and 3A, provide system configuration examples in which the charges stored within the capacitances $C_1$, $C_2$, and $C_5$ can be assumed to be conserved, and thus allow the peak plasma potential $V_{PL}$ to be determined by use of one or more of the methods described herein. The electrical signals that are detected within the one or more methods described herein can include one or more characteristics of waveforms generated by the PV waveform generator 150 and/or the RF generator 118. The detected one or more waveform characteristics can include but are not limited to voltage at one or more times within a pulse, slope at one or more times within a pulse, a pulse period, and pulse repetition frequency. However, the assumption that charge is conserved in a region surrounding a node, such as node $N_1$ in FIGS. 2A-2B and 3B, is limited by or depends on the amount of stored charge lost due to a magnitude of the current that flows to ground, such as the current (FIG. 3B) that flows through the blocking resistor $R_1$ to ground. As is further discussed below, the ability to accurately determine the peak plasma potential $V_{PL}$ is dependent on the blocking resistor's ability to assure that the amount of charge lost is negligible prior to the signal detection module 188 measuring the generated electrical signals during one or more of the phases of a burst sequence, which includes at least one burst-on period 310 and burst-off period 314. As noted above, it is desirable that the resistance of the resistor $R_1$ be >100 kOhm, for example.

Example 1

In one example, based on the system 300 configuration illustrated in FIGS. 3A-3B, for node $N_1$, equation (2) can be rewritten as shown in equation (3).

$$C_1(\Delta V_1)_{Burst} + C_2(\Delta V_2)_{Burst} + C_5(\Delta V_5)_{Burst} = C_1(\Delta V_1)_{Off} + C_2(\Delta V_2)_{Off} + C_5(\Delta V_5)_{Off} \qquad (3)$$

In equation (3), $C_1$, $C_2$, and $C_5$ are the capacitances that are known, and $\Delta V_1$, $\Delta V_2$, and $\Delta V_5$ are the voltages of the capacitor plates directly coupled to node $N_1$ minus the voltages of the opposing capacitor plates for the capacitances $C_1$, $C_2$, and $C_5$, which are measured during either the burst-on period 310 or burst-off period 314. Therefore, if the measurement made during the burst-on period 310 is made at one of the time $T_1$ instants in time, and the measurement made during the burst-off period 314 is made at time $T_4$, equation (3) can be rewritten as equation (4).

$$C_1(V_1 - V_{PL}) + C_2(V_1 - V_5) + C_5(V_1 - V_3) = C_1(V_2 - 0) + C_2(V_2 - V_6) + C_5(V_2 - V_4) \qquad (4)$$

In equation (4), the voltage $V_1$ is the voltage of the electrode 104 at time $T_1$ during the burst-on period 310, the peak plasma potential $V_{PL}$ is the plasma potential at time $T_1$ during the burst-on period 310, the voltage $V_5$ is the voltage measured at node $N_5$ at time $T_1$ during the burst-on period 310, the voltage $V_3$ is the voltage measured at node $N_3$ at time $T_1$ during the burst-on period 310, the voltage $V_2$ is the voltage measured at node $N_1$ during the burst-off period 314, the voltage $V_6$ is the voltage measured at node $N_5$ during the burst-off period 314, and the voltage $V_4$ is the voltage measured at node $N_3$ during the burst-off period 314. As noted above, the plasma potential is effectively zero during the burst-off period and thus the charge stored in the capacitor $C_1$ during the burst-off period 314 is effectively equal to the voltage $V_2$ times the capacitance $C_1$. The actual clamping voltage during burst off period is $V_2$. Therefore, after reorganizing equation (4), which is shown in equation (5), the peak plasma potential $V_{PL}$ can be found by solving the equation (5) for the system configuration illustrated in FIG. 3B.

$$V_{PL} = (V_1 - V_2)\left(1 + \frac{C2 + C5}{C1}\right) + \frac{C2}{C1}(V_6 - V_5) + \frac{C5}{C1}(V_4 - V_3) \quad (5)$$

For simplicity of discussion, each of the capacitance terms that are multiplied by the voltage difference terms in equation (5), and any of the equations provided below, are generally referred to herein as a "combined circuit capacitance" that has a combined circuit capacitance value, which is determined by the arithmetic combination of the capacitances (e.g., capacitances $C_1$, $C_2$, and $C_5$ in equation (5)) based on the configuration of the various connected circuit elements (e.g., electrostatic chuck 191, RF generator 118, and PV waveform generator 150) relative to a desired node (e.g., node $N_1$).

However, in configurations where the biasing element (e.g., PV source 150) connected at node $N_3$ floats during the burst-off period, or is disconnected from ground during the burst-off period, the capacitor $C_5$ which is directly coupled to node $N_3$ will not have current through it during the burst-on to burst-off transition. In other words, the charge stored in capacitor $C_5$ is the same during the burst-on to burst-off transition, so its effect can be removed from the charge conservation equations (2), (3) and (4). The equation used to find the voltage $V_{PL}$ can be simplified to equation (6).

$$V_{PL} = (V_1 - V_2)\left(1 + \frac{C2}{C1}\right) + \frac{C2}{C1}(V_6 - V_5) \quad (6)$$

In some embodiments, there is negligible current flowing through the RF source assembly 163 to the capacitor $C_2$ coupled at node $N_5$ during the burst-on to burst-off transition, so that the majority of current flowing through $C_2$ also flows through $C_3$. Thus, the series of $C_2$ and $C_3$ can be treated as one capacitor of value $(C_2C_3)/(C_2+C_3)$ and grounded. Thus, in equation (6), $V_5=V_6=0$ and $C_2$ is replaced by $(C_2C_3)/(C_2+C_3)$.

$$V_{PL} = (V_1 - V_2)\left(1 + \frac{C2C3}{C1(C2+C3)}\right) \quad (7)$$

Therefore, since the capacitance $C_1$ is typically much larger that the capacitances $C_2$ and $C_3$ in most systems, equation (7) can be reduced to the simple equation, in this example, of a floating biasing element, shown in equation (8).

$$V_{PL} \approx V_1 - V_2 \quad (8)$$

In any case, using either equations (5), (6), (7) or (8), the knowledge of the capacitance values of $C_1$, $C_2$, $C_3$, and/or $C_5$, and the measured voltages detected during the burst-on period 310 and burst-off period 314 by use of the signal detection module 188, the peak plasma potential $V_{PL}$ can be calculated so that the desired clamping voltage $V_{DCV}$ can be determined.

Example 2

In another example, the biasing element (e.g., PV source 150) connected at node $N_3$ is controlled at a constant voltage $V_4$ (such as zero) during the burst-off period. In some embodiments, there is negligible current flowing through the RF source assembly 163 to the capacitor $C_2$ coupled at node $N_5$ during the burst-on to burst-off transition, so that the majority of current flowing through $C_2$ also flows through $C_3$. Then the voltage $V_{PL}$ can be found by solving equation (9) for the system configuration illustrated in FIG. 3B.

$$V_{PL} = (V_1 - V_2)\left(1 + \frac{C2C3 + C2C5 + C3C5}{C1(C2+C3)}\right) + \frac{C5}{C1}(V_4 - V_3) \quad (9)$$

In this case, using equation (9), the knowledge of the capacitance values of $C_1$, $C_2$, $C_3$, and/or $C_5$, and the measured voltages during the burst-on period 310 and burst-off period 314 by use of the signal detection module 188, the peak plasma potential $V_{PL}$ can be calculated so that the desired clamping voltage $V_{DCV}$ can be determined.

Example 3

In another example, based on the system 500 configuration illustrated in FIG. 5A, equation (2) can be rewritten as shown in equation (10). In this example, as schematically shown in FIG. 5A, the RF source assembly 163 is connected to node $N_5$ and is utilized to generate substrate bias voltage during plasma processing. In this example, a PV waveform generator 150 is not connected to the system 500. Equation (2) can thus be rewritten as shown in equation (10).

$$C_1(\Delta V_1)_{Burst} + C_2(\Delta V_2)_{Burst} = C_1(\Delta V_1)_{Off} + C_2(\Delta V_2)_{Off} \quad (10)$$

Therefore, voltage $V_{PL}$ can be found by use of equation (11).

$$V_{PL} = (V_1 - V_2)\left(1 + \frac{C2}{C1}\right) + \frac{C2}{C1}(V_6 - V_5) \quad (11)$$

In this case, using equation (11), the knowledge of the capacitance values of $C_1$ and $C_2$, and the measured voltages during the burst period 510 and burst-off period 514 by use of the signal detection module 188, the peak plasma potential $V_{PL}$ can be calculated so that the desired clamping voltage $V_{DCV}$ can be determined.

Plasma Processing Method Examples

FIG. 6A is a process flow diagram of a method 600 for determining a desired clamping voltage based on the application of a process recipe that is used during plasma processing of a substrate in a processing chamber. In addition to FIG. 6A, the method 600 is described in reference to FIGS. 1A-5B. In one embodiment, the method 600 can be performed by executing, by the CPU 133, computer implemented instructions that are stored within the memory 134 of the controller 126. In one embodiment, the method 600 at least includes a clamping voltage determination process 605, which includes operations 606-614.

At operation 602, a processing recipe is initiated in a processing chamber 100, which causes a plasma 101 to form in the processing region 129 of the processing chamber 100. In some embodiments, during this operation, the RF source assembly 163 delivers enough RF power at an RF frequency to an electrode within the processing chamber to form the plasma 101. In one example, the RF source assembly 163 delivers RF power at an RF frequency of between 400 kHz and 100 MHz, such as 40 MHz to the support base 107 disposed within the substrate support assembly 136. The RF power delivered to the support base 107 is configured to ignite and maintain a processing plasma 101 formed by use of processing gases disposed within the processing volume 129.

At operation 604, the controller 126 sends a command signal to the DC voltage source $P_2$ to initiate and establish a first clamping voltage at the biasing electrode 104. The magnitude of the first clamping voltage is set to the clamping voltage in the recipe which is stored in the memory of the controller 126. The recipe set point is generally set to a level that through initial testing or by general knowledge has a magnitude that is low enough to not cause breakdown of top dielectric layer within the substrate support, but has a magnitude high enough to achieve good thermal contact with the substrate receiving surface 105A in order to seal substrate backside gas (e.g. helium) sufficiently.

At operation 606, in one embodiment, the PV waveform generator 150 begins to generate a series of PV waveforms that establishes a PV waveform at the biasing electrode 104. During operation 606, the PV generator 150 can be configured to generate and provide bursts 316 of PV waveforms to the biasing electrode 104 within the processing chamber 100. In an alternate embodiment, the RF source assembly 163 begins to generate bursts of RF waveforms, as discussed in relation to FIG. 5B, at an electrode (e.g., support base 107) within the processing chamber 100.

In some embodiments, during operation 606, it is desirable for the pulse voltage level (e.g., $V_{pp}$) applied to the electrode, such as the biasing electrode 104, to be controlled at a desired ramp rate that is not greater than the rate to charge or discharge the capacitors $C_5$ and $C_6$ through resistors $R_1$ and $R_2$ respectively, (FIG. 3B), so that the actual clamp voltage across capacitor $C_1$ remains constant while $V_{DCV}$ and VPS are ramped together with the pulse voltage V. If such ramp rate relation is satisfied, according to equation (1), the actual clamp voltage across capacitor $C_1$ will be kept close to the clamp voltage set point $V_{Clamp}$ during the pulse voltage ramping. The charge or discharge rate of capacitor $C_5$ through resistor $R_1$ is determined by the RC time constant $$\tau_1 = R_1(C_5) \quad (12).$$

The charge or discharge rate of capacitor $C_6$ through resistor $R_2$ is determined by the RC time constant $$\tau_2 = R_2(C_6) \quad (13).$$

Therefore, the ramp time for the pulse voltage level $V_{pp}$ change should be larger than the RC time constants $\tau_1$ and $\tau_2$. In some embodiments, the ramp time for the pulse voltage level $V_{pp}$ is set to be at least three times of the larger of the RC time constants $\tau_1$ and $\tau_2$.

At operation 608, while ramping pulse voltage level (e.g., $V_{pp}$) applied to the biasing electrode 104, the signal detection module 188 is used to monitor the waveforms established within different portions of the processing chamber 100 during the execution of the plasma processing recipe. In one example, the signal detection module 188 is configured to monitor the waveforms established at the biasing electrode 104 and the support base 107 over time, while the pulsed voltage level is ramped. In one example, the waveforms established at the biasing electrode 104 and the support base 107 can be detected by measuring waveform signals established at nodes $N_1$ and $N_5$ within the system 300 or 500 illustrated in FIG. 3B or 5A, respectively. In general, during operation 608 the signal detection module 188 is used to continuously monitor or repetitively sample the waveform signals established at the various nodes within a system over time, such as detecting the waveform signals at one or more of the times $T_1$-$T_5$ illustrated in FIG. 3A, 4A or 5B.

At operation 610, the information collected during operation 608 is used to calculate the plasma potential during the plasma process by use of at least one equation that is derived from equation (2), such as equations (5), (6), (7), (8), (9) or (11). The desired equation that is to be used to determine the peak plasma potential $V_{PL}$ is based on a knowledge of the system configuration that is being used during plasma processing and/or a setting found in the software instructions stored within memory. Typically, when the pulse voltage level, RF power, or other plasma relevant parameters (e.g. pressure, gas composition, etc.) are changing during plasma processing, one or more of the relevant equations, which are incorporated within the instructions stored in the memory of the controller 126, can be used during the execution of the stored instructions by the CPU 133 to determine the peak plasma potential $V_{PL}$ at any time during processing.

At operation 612, the desired clamping voltage $V_{DCV}$ that is to be used during a subsequent portion of the current plasma process is determined by use of equation (1) and the results of operation 610. As discussed above, the clamp voltage set point ($V_{Clamp}$) found in equation (1) is the clamp voltage set point in the recipe, typically a predetermined value that is stored within the memory of the controller 126.

At operation 614, a command signal is then sent by the controller 126, or the feedback processor 125, to the DC voltage source $P_2$ so that a desired clamping voltage $V_{DCV}$ can be applied to the biasing electrode 104 by setting the DC voltage source $P_2$ voltage properly, as discussed above. In some embodiments, operations 606-614 of the clamping voltage determination process 605 are repeated during the pulse voltage ramping phase at least one more time, or until a desired pulse voltage level (e.g., $V_{pp}$) is achieved during a burst-on period 310 during plasma processing. In some other embodiments, only operations 608-614 of the clamping voltage determination process 605 are repeated one or more times during plasma processing. In one example, operations 608-614 are repeated one or more times once the desired pulse voltage level (e.g., $V_{pp}$) has been achieved during a burst-on period 310.

After a steady state value for the pulse voltage level (e.g., $V_{pp}$) has been achieved after performing operation 608-614 one or more times, operation 616 is performed in which the set point of the DC voltage source $P_2$, or DC voltage source output voltage $V_{BCM}$, is stored in memory. In some embodiments, it is desirable to store intermediate set point of DC voltage source output voltage $V_{BCM}$ values (e.g., non-final values determined during the pulse voltage ramping phase) in memory so that they can be used as a baseline in a future plasma processing sequence. The set point of DC voltage source output voltage $V_{BCM}$ that is stored in memory can be used in future plasma processes performed on additional substrates that are processed using the same or similar plasma processing recipe. As briefly discussed above, plasma processing recipes generally include one or more processing steps that are adapted to control one or more plasma processing parameters performed on a substrate disposed within a processing chamber. The one or more plasma processing parameters can include PV waveform characteristics (e.g., duty cycle, pulse voltage level $V_{pp}$, burst period, burst off period, pulse voltage on-time, etc.), chamber pressure, substrate temperature, gas flow rates, gas composition, and other useful parameters. For example, the PV waveform generator 150 is set to provide pulses having a pulse voltage level (e.g., $V_{pp}$) from 0.01 kV to 10 kV and the DC voltage source output voltage $V_{BCM}$ of the clamping network 116 is set to a constant DC voltage between −3 kV to +3 kV, such as +2.5 kV.

Referring to FIG. 4C, in some embodiments, the generated series of PV waveforms formed during operation 606 include establishing a series of PV waveforms within a burst 490. The "low" pulse voltage level $V_{pp}$ found in the PV waveforms formed during burst 492 have a magnitude that is significantly less than the "high" pulse voltage level $V_{pp}$ found in burst 491. The "high" pulse voltage level $V_{pp}$ found in burst 491 will have the greatest effect on the desired clamping voltage $V_{DCV}$ set point, due to larger peak-to-peak pulse voltage. Therefore, in some embodiments, since the system is configured such that charge conservation is maintained within a region of an electrode biasing circuit that is coupled to an electrode, the peak plasma potential VPS achieved during the "high" pulse voltage level $V_{pp}$ can be used to determine the set point of DC voltage source output voltage $V_{BCM}$ even though the "low" pulse voltage level $V_{pp}$ containing burst 492 is positioned between the "high" pulse voltage level $V_{pp}$ containing burst 491 and the burst off period 493. In one example, one of the equations (5), (6), (7), (8), (9) or (11) can be used to determine the plasma potential during the plasma processing.

Referring to FIG. 4D, in some embodiments, the generated series of PV waveforms formed during operation 606 include establishing a series of PV waveforms within a burst 494. In some embodiments, since the system is configured such that charge conservation is maintained within a region of an electrode biasing circuit, the peak plasma potential VPS achieved during the "high" pulse voltage level $V_{pp}$ can be determined and used to determine the set point of DC voltage source output voltage $V_{BCM}$ even though the "low" pulse voltage level $V_{pp}$ containing burst 492 is positioned between the "high" pulse voltage level $V_{pp}$ containing burst 491 and the burst off period 493. Therefore, equations (5), (6), (7), (8), (9) or (11) can be used to determine the plasma potential during the plasma processing.

Figure 6B:
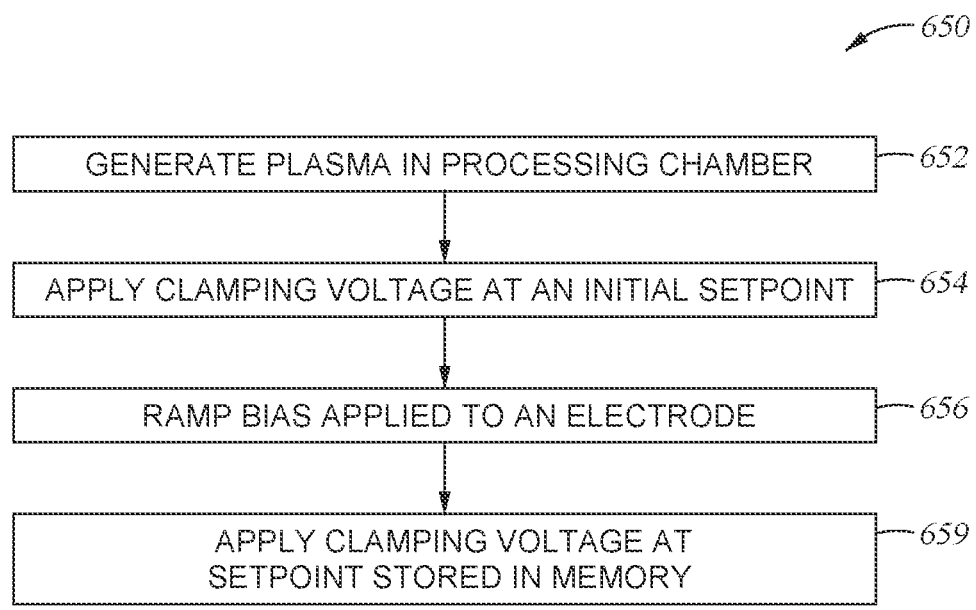

FIG. 6B is a process flow diagram of a method 650 that is used to deliver a desired clamping voltage $V_{DCV}$ based on the determination of the set point of DC voltage source output voltage $V_{BCM}$ in a prior plasma processing sequence, such as after performing method 600 at least once. The method 650 can be performed by executing, by the CPU 133, computer implemented instructions that are stored with the memory 134 of the controller 126.

At operation 652, a processing recipe is initiated in a processing chamber by forming a plasma 101 in the processing region 129 of a processing chamber. Operation 652 can be performed in a manner similar to methods described above in relation to operation 602.

At operation 654, the controller 126 sends a command signal to the DC voltage source $P_2$ to initiate and establish a first clamping voltage at the biasing electrode 104. The magnitude of the first clamping voltage is set based on a set point in the processing recipe or stored in the memory of the controller 126. In one embodiment, the stored set point is based on a DC voltage source output voltage $V_{BCM}$ value used during a prior performed process, such as a result from the performance of one of the operations found in method 600.

At operation 656, in one embodiment, the PV waveform generator 150 begins to generate a series of PV waveforms that establish a PV waveform at the biasing electrode 104. In an alternate embodiment, the RF source assembly 163 begins to generate an RF waveform that establishes a RF waveform at an electrode, such as the support base 107, within the processing chamber 100. As discussed above in relation to operation 606, the pulse voltage level (e.g., $V_{pp}$) applied to the electrode is ramped within a time period that is larger (e.g. twice or three times larger) than the RC time constants to charge or discharge $C_5$ through $R_1$ and $C_6$ through $R_2$. Typically, operation 656 is performed in a manner that is similar to methods described above in relation to operation 606.

At operation 659, at the same time of operation 656, a command signal is sent by the controller 126, or the feedback processor 125, to the DC voltage source $P_2$ to reach a set point of the DC voltage source output voltage $V_{BCM}$ so that a desired clamping voltage $V_{DCV}$ is applied to and maintained at the biasing electrode 104 by the DC voltage source $P_2$ during at least a portion of the processing steps performed on the substrate. The method 650 can additionally be performed on all of the substrates that subsequently processed in the processing chamber. However, if one or more plasma processing recipe parameters are altered in any subsequent plasma processes it may be desirable to perform method 600 and then method 650 on all of the subsequent processes performed using these altered plasma processing recipe parameters.

In some embodiments, steps 608-614 in method 600 can be used repeatedly within a processing step to adjust for plasma property and peak plasma potential $V_{PL}$ drift which results in different DC voltage source output voltage $V_{BCM}$ of the DC voltage source $P_2$ in order to maintain the clamp voltage set point $V_{Clamp}$.

DC Bias Analysis Example

In some embodiments, the amount of DC bias ($V_{DC\ Bias}$) applied to a substrate during processing is calculated and then used to adjust one or more of the processing parameters during one or more portions of a plasma processing recipe. The DC bias at any time during plasma processing, in which a symmetric waveform (e.g., sinusoidal waveform (RF waveform) or sigmoidal waveform) is delivered, can be calculated by use of equation (14).

$$V_{DC\ Bias}=(V_{PL}-V_{pp})/2 \quad (14)$$

During one or more of the operations described herein, the signal detection module 188 and controller 126 are used to detect and monitor the waveform signals established at the various nodes within a system over time, so that one or more computer implemented instructions can be used to determine the DC bias and/or peak DC bias.

Aspects of one or more of the embodiments disclosed herein include a system and method of reliably biasing and clamping a substrate during processing to improve the plasma processing results performed on a plurality of substrates.

While the foregoing is directed to embodiments of the present disclosure, other and further embodiments of the disclosure may be devised without departing from the basic scope thereof, and the scope thereof is determined by the claims that follow.

What is claimed is:

1. A plasma processing chamber, comprising: a substrate support assembly, comprising:
a substrate supporting surface;
a first biasing electrode;
a first dielectric layer disposed between the first biasing electrode and the substrate supporting surface;
a waveform generator configured to generate a plurality of pulsed voltage waveforms during a first time period and halt generation of the plurality of pulsed voltage waveforms during a second time period;
a first power delivery line that electrically couples the waveform generator to the first biasing electrode, wherein the first power delivery line comprises a blocking capacitor;
a clamping network coupled to the first power delivery line at a first point between the blocking capacitor and the first biasing electrode, the clamping network comprising:
a direct-current (DC) voltage source coupled between the first point and ground; and
a blocking resistor coupled between the first point and an output of the DC voltage source; and
a controller configured to:
receive, during the first time period and the second time period, information within a first electrical signal obtained via a first signal trace coupled to the first point, wherein the information within the first electrical signal obtained during the first time period comprises a portion of a waveform of the plurality of pulsed voltage waveforms that comprises a first voltage level, and wherein the information within the first electrical signal obtained during the second time period comprises a second voltage level;
compare the first voltage level with the second voltage level; and
control a magnitude of a voltage the DC voltage source supplies to the first point of the first power delivery line based on comparing the first voltage level with the second voltage level.

2. The plasma processing chamber of claim 1, wherein the substrate support assembly comprises an electrostatic chuck, wherein the electrostatic chuck comprises the first dielectric layer and the first biasing electrode.

3. The plasma processing chamber of claim 1, wherein the blocking resistor has a resistance greater than 100 kOhms.

4. The plasma processing chamber of claim 1, wherein
the substrate support assembly further comprises:
a support base; and
a second dielectric layer disposed between the support base and
the first biasing electrode; and
a radio frequency generator electrically coupled to the support base through a second power delivery line, and configured to establish a radio frequency voltage waveform at the support base.

5. The plasma processing chamber of claim 1, wherein the first dielectric layer has a thickness of between about 0.1 mm and about 2 mm.

6. The plasma processing chamber of claim 1, wherein the clamping network is connected in parallel with the waveform generator, and the clamping network further comprises:
a first diode coupled in parallel with the blocking resistor between the first point and the DC voltage source, wherein an anode side of the diode is coupled to the first point;
a first capacitor coupled between a cathode side of the diode and ground; and
a second resistor in series with the DC voltage source is coupled in parallel with the first capacitor.

7. The plasma processing chamber of claim 1, wherein the substrate support assembly further comprises a second biasing electrode, wherein the first biasing electrode and the second biasing electrode are each selected from a group consisting of an edge control electrode and a chucking pole electrode.

8. A plasma processing chamber, comprising:
a substrate support assembly, comprising:
a substrate supporting surface;
a first electrode;
a first dielectric layer disposed between the first electrode and the substrate supporting surface;
a waveform generator configured to generate a plurality of pulsed voltage waveforms during a first time period and halt generation of the plurality of pulsed voltage waveforms during a second time period;
a first power delivery line that electrically couples the waveform generator to the first electrode, wherein the first power delivery line comprises a blocking capacitor;
a clamping network coupled to the first power delivery line at a first point between the blocking capacitor and the first electrode, the clamping network comprising:
a direct-current (DC) voltage source coupled between the first point and ground; and
a blocking resistor coupled between the first point and the DC voltage source;
a first signal trace coupled to the first power delivery line between the blocking capacitor and the first electrode, the first signal trace configured to receive a first electrical signal; and
a controller configured to:
receive, during the first time period and the second time period, information within the first electrical signal obtained via the first signal trace coupled to the first point, wherein the information within the first electrical signal obtained during the first time period comprises a portion of a waveform of the plurality of pulsed voltage waveforms that comprises a first voltage level, and wherein the information within the first electrical signal obtained during the second time period comprises a second voltage level;
compare the first voltage level with the second voltage level; and
control a magnitude of a voltage the DC voltage source supplies to the first point of the first power delivery line based on comparing the first voltage level with the second voltage level.

9. The plasma processing chamber of claim 8, further comprising a diode coupled in parallel with the blocking resistor between the first point and the DC voltage source, wherein an anode side of the diode is coupled to the first point.

10. The plasma processing chamber of claim 8, wherein the substrate support assembly comprises an electrostatic chuck, wherein the electrostatic chuck comprises the first dielectric layer and the first electrode.

11. The plasma processing chamber of claim 8, wherein the blocking resistor has a resistance greater than 100 kOhms.

12. The plasma processing chamber of claim 8, wherein the substrate support assembly further comprises:

a support base; and
a second dielectric layer disposed between the support base and the first electrode; and
a radio frequency generator electrically coupled to the support base through a second power delivery line, and is configured to establish a radio frequency voltage waveform at the support base.

13. The plasma processing chamber of claim 8, wherein the first dielectric layer has a thickness of between about 0.1 mm and about 2 mm.

14. The plasma processing chamber of claim 8, wherein the clamping network is connected in parallel with the waveform generator, and the clamping network further comprises:
- a first diode coupled in parallel with the blocking resistor between the first point and the DC voltage source, wherein an anode side of the diode is coupled to the first point;
- a first capacitor coupled between a cathode side of the diode and ground; and
- a second resistor in series with the DC voltage source is coupled in parallel with the first capacitor.

15. The plasma processing chamber of claim 8, wherein the first electrode comprises an edge control electrode or a chucking pole electrode.

\* \* \* \* \*